United States Patent [19]
Ishikawa et al.

[11] Patent Number: 5,444,595
[45] Date of Patent: Aug. 22, 1995

[54] LOAD DRIVE APPARATUS INCLUDING POWER TRANSISTOR PROTECTION CIRCUIT FROM OVERCURRENT

[75] Inventors: Fukuo Ishikawa, Kariya; Shuuichi Konishi, Nagoya; Katsumi Nakamura, Okazaki; Hideyuki Ikemoto, Anjo; Toshio Ishida, Kariya, all of Japan

[73] Assignees: Nippondenso Co., Ltd., Kariya; Anden Co., Ltd., Anjo, both of Japan

[21] Appl. No.: 311,938

[22] Filed: Sep. 26, 1994

[30] Foreign Application Priority Data

Sep. 27, 1993 [JP] Japan .................................. 5-240036
Oct. 20, 1993 [JP] Japan .................................. 5-296580
Nov. 26, 1993 [JP] Japan .................................. 5-296566

[51] Int. Cl.[6] .............................................. H02H 7/16
[52] U.S. Cl. .......................................... 361/86; 361/87; 361/93
[58] Field of Search .................. 361/15, 86, 87, 93; 320/39; 363/52

[56] References Cited

U.S. PATENT DOCUMENTS 5,200,879  4/1993  Sasagawa et al. ...................... 361/93
5,301,085  4/1994  Miettinen ................................ 361/93

FOREIGN PATENT DOCUMENTS 50-36942  4/1975  Japan .
57-3863   1/1982  Japan .
59-32224  2/1984  Japan .
64-90831  4/1989  Japan .

*Primary Examiner*—Todd DeBoer
*Attorney, Agent, or Firm*—Cushman, Darby & Cushman

[57] ABSTRACT

A load drive apparatus is used in a vehicle direction indicating apparatus operable free from overcurrents and overvoltage. The load drive apparatus includes: a charging/recharging capacitor; a charging/recharging circuit for charging/recharging the capacitor at a preselected time constant in such a manner that a voltage across the capacitor is varied between a preset upper limit voltage and a preset lower limit voltage; a drive circuit for turning ON a power transistor series-connected to a current path employed to supply a current from a DC power source to a load, thereby driving the load when the charging/discharging circuit causes the capacitor to be charged, or the voltage across the capacitor is higher than, or equal to a predetermined voltage defined between the upper limit voltage and the lower limit voltage; overcurrent judging means for judging whether or not a voltage across terminals of the power transistor connected to the above-described current path exceed an overcurrent judging voltage.

17 Claims, 11 Drawing Sheets

LOAD DRIVE APPARATUS INCLUDING POWER TRANSISTOR PROTECTION CIRCUIT FROM OVERCURRENT

BACKGROUND OF THE INVENTION

1. Field of the Invention

The present invention generally relates to a load drive apparatus including a power transistor. More specifically, the present invention is directed to a protection circuit for a power transistor that is periodically turned ON/OFF in response to an oscillation signal produced by charging/discharging a capacitor.

2. Description of the Related Art

Conventionally, in either drive apparatus for turning ON/OFF lamps of flashing lights, or PWM control apparatus for driving motors and lamps in the PWM (pulse width modulation) signal, a power transistor is provided in series with a current path used to supply a DC current from a DC power source to a load. Then, this power transistor is periodically turned ON/OFF in response to an oscillation signal obtained by charging/discharging a capacitor.

In other words, in this sort of apparatus, the charging/discharging capacitor is charged/discharged via a resistor in such a manner that the voltage across this capacitor is varied between preselected two values. This periodical ON/OFF operation of he power transistor is performed in such a manner that the power transistor is turned ON during the charging operation of the capacitor, and turned OFF during the discharge operation thereof. Otherwise, such a drive signal (PWM signal) having a desired duty ratio is produced by comparing the voltages across the capacitor, which are varied by the charging/discharging operations, with the reference voltage, and then the power transistor is turned ON/OFF in response to this PWM signal.

On the other hand, normally such a protection apparatus as disclosed in Japanese Laid-open Patent Application No. 59-32224 opened in 1984 is employed in the power transistor used in this of load drive apparatus. That is, to protect the power transistor from overcurrents or overheat dissipation, which is caused by short-circuiting, or disconnecting the current path into which this power transistor is inserted, this protection apparatus is operated as follows: After a predetermined delay time has passed since the power transistor is turned ON, a judgement is made whether or not overcurrents may flow through the power transistor by checking whether or not the voltage across the terminals of the power transistor connected to the current path of the load is higher than a predetermined voltage. It should be noted that this terminal voltage corresponds to a collector-to-emitter voltage VCE when a bipolar transistor employed as the power transistor, or this terminal voltage corresponds to a drain-to-source voltage VDS when a field-effect transistor (FET) is employed as this power transistor. When it is so judged that the overcurrents may flow through the power transistor, the power transistor is compulsorily and continuously turned OFF via a latch circuit constructed of a thyristor and transistors.

However, the above-described conventional protection apparatus own such a problem that heat dissipation of the power transistor is gradually increased and then the power transistor would be electrically destroyed even if the above-explained protection apparatus is employed. This is because when either the drive signal of the power transistor is brought into the OFF state, or the power supply switch is brought into the OFF state, which is separately provided in the current path from the power supply to the load, the latching operation by the latch circuit is released and the power transistor may be again turned ON if the subsequent load driving Operation is commenced, whereby when the power transistor is periodically turned ON/OFF by the above-explained drive apparatus, or the power supply switch is repeatedly turned ON, this power transistor would be overheated.

In other words, in accordance with the conventional protection apparatus, after a preselected delay time has passed since the power transistor is turned ON, a judgement is made of such an overcurrent caused by a short-circuit of the load, or an increase in the internal resistance of the power transistor based upon the terminal voltage of the power transistor, and therefore the power transistor is turned OFF, whereby the power transistor is caused to be turned OFF. As a result, a current may necessarily flow through the power transistor for a predetermined time period after the power transistor is turned ON. Consequently, when either the power transistor is periodically turned ON/OFF by the above-explained drive apparatus, or the power supply switch is repeatedly turned ON/OFF, the current must flow through this power switch for a preselected time period even if the protection apparatus is employed. As a consequence, this current may emphasize heat dissipation of the power transistor, and finally could electrically destroy this power transistor.

Also, the conventional protection apparatus is susceptible to adverse influences of noise, and therefore owns such a problem that the power transistor is compulsorily turned OFF even when no overcurrent may flow through the power transistor. That is, for example, overcurrents are erroneously judged due to noise appearing in the current path where the power transistor is employed, so that the latch circuit would be operated, or the latch circuit would be directly actuated by this noise.

It should be noted that to prevent such an erroneous judgement of the over currents caused by the noise, after the overcurrents are judged from the terminal voltage of the power transistor, this judgement signal may be delayed by the integral circuit and the like to supply the delayed judgement signal to the latch circuit. In this case, such a delay circuit as the integral circuit should be separately provided, and nevertheless it could not prevent the erroneous operation of the latch circuit caused by the noise.

SUMMARY OF THE INVENTION

The present invention has been made in an attempt to solve the above-described problems, and therefore, has a primary object to provide a protection apparatus of a power transistor, capable of correctly judging without any adverse influences of noise whether or not an overcurrent flows through a power transistor which is periodically turned ON/OFF in response to an oscillation signal produced by charging/discharging a capacitor, as described above, and furthermore capable of surely protecting the power transistor after the overcurrent judgement.

To achieve the primary object, a load drive apparatus according to a first aspect of the present invention is provided which comprises: a charging/recharging capacitor; a charging/recharging circuit for charging/recharging the capacitor at a preselected time constant in such a manner that a voltage across the capacitor is varied between a preset upper limit voltage and a preset lower limit voltage; a drive circuit for turning ON a power transistor series-connected to a current path employed to supply a current from a DC power source to a load, thereby driving the load when the charging-/discharging circuit causes the capacitor to be charged, or the voltage across the capacitor is higher than, or equal to a predetermined voltage defined between the upper limit voltage and the lower limit voltage; overcurrent judging means for judging whether or not a voltage across terminals of the power transistor connected to the above-described current path exceed an overcurrent judging voltage; upper voltage changing means for changing the upper limit voltage at which the charging/discharging circuit stops the charging operation of the capacitor and starts the discharging operation thereof, into a value normally higher than a drive stopping judgement voltage when the overcurrent judging means judges that the terminal voltage exceeds the overcurrent judging voltage; and first drive stopping means for compulsorily turning OFF the power transistor and further for holding the charging/discharging circuit to the charging state of the capacitor by judging whether or not the voltage across the terminals of the capacitor is higher than, or equal to the drive stop judging voltage when the voltage across the terminals of the capacitor becomes higher than, or equal to the drive stop judging voltage.

As described above, the load drive apparatus according to the first aspect of the present invention is provided with the drive apparatus for turning ON/OFF the power transistor in response to the oscillation signal obtained by charging/discharging the capacitor. In this load drive apparatus, the overcurrent judging means will judge whether or not the overcurrent flows through the power transistor by checking as to whether or not the voltage across the terminals of the power transistor exceeds the overcurrent judging voltage. Then, when this overcurrent judging means judges that the voltage across the terminals of the power transistor exceeds the overcurrent judging voltage, the upper limit voltage changing means changes the upper limit voltage into the higher voltage than the drive stop judging voltage, at which upper limit voltage the charging-/discharging circuit employed in the drive apparatus stops the charging operation of the capacitor to commence the discharging operation. The first drive stopping means judges whether or not the voltage across the capacitor is higher than, or equal to the drive stop judging voltage. When the terminal voltage becomes higher than the normally large drive stop judging voltage, the power transistor is forcibly turned OFF to maintain the charging/discharging circuit under the charging stage of the charging/discharging circuit.

In other words, according to the present invention, when the voltage across the terminals of the transistor exceeds the overcurrent judging voltage, and the overcurrent judging means judges that the overcurrent flows through the power transistor, the charging/discharging circuit continues to charge the capacitor until the voltage across the terminals of the capacitor becomes higher than, or equal to the voltage normally higher than the drive stop judging voltage. When the voltage across the terminals of the capacitor becomes higher than the drive stop voltage, the first drive stopping means turns OFF the power transistor. As a consequence, in accordance with the present invention, the time period defined after the overcurrent judging means judges the occurrence of overcurrent, and until the power transistor is turned OFF, is delayed by the charging time of the capacitor. If the voltage across the terminals of the power transistor is returned to the normal voltage during this delay time period, since the upper limit voltage changing means stops its operation, the charging/discharging circuit stops the charging operation of the capacitor and commences the discharging operation.

As a consequence, in accordance with the load drive apparatus of the present invention, even when the overcurrent judging means temporarily and erroneously judges the occurrence of overcurrent due to the adverse influence of noise, the power transistor is not compulsorily turned OFF. Moreover, since the charging/discharging circuit employed in the drive apparatus is utilized due to its delay, it can be realized without employing such a specific delay circuit.

Next, the drive stopping means not only compulsorily turns OFF the power transistor when the voltage across the terminals of the capacitor is higher than the drive stop judging voltage, but also maintains the charging-/discharging circuit under the charging state of the capacitor. As a consequence, after the power transistor is once turned OFF since the judgement was made of the overcurrent, the capacitor is continued to be charged even after this terminal voltage reaches the drive stop judging voltage. Finally, this terminal voltage is kept as the maximum rechargeable voltage within the charging/discharging circuit.

As a consequence, in accordance with the present invention, after the power transistor is once turned OFF, this OFF-state is maintained by charging the capacitor. Even when the first drive stopping means temporarily and erroneously judges that the voltage across the terminals of the capacitor becomes below the drive stop judging voltage due to noise after the first drive stopping means has once turned OFF the power transistor, there is no case that the OFF-state of the power transistor is released. When the drive stopping means erroneously judges that the voltage across the terminals of the capacitor becomes higher than the drive stop judging voltage due to noise, the power transistor is temporarily turned OFF in response to this erroneous judgement. In this case, since the capacitor is not charged in such a manner that the voltage across the terminals of the capacitor becomes higher than, or equal to the drive stop judging voltage, the OFF-state of the power transistor is not held.

Also, as described above, in the present invention, when the OFF-state of the power transistor is latched by charging the capacitor, and then the voltage across the terminals of the capacitor becomes below than the drive stop judging voltage, this latching condition is released. Accordingly, even if the power supply switch separately employed in the current path from the power supply to the load would be repeatedly turned ON, the OFF-state of the power transistor could be maintained, but this power transistor would not be driven to the ON-state every time the power switch is turned ON.

Then, the inventors of the present invention have studied overvoltage protections of the above-mentioned power transistor in case when the above-described load drive apparatus was applied to such a two-terminal type load drive apparatus that the power transistor was utilized as a high-side switch.

That is, in the conventional control apparatus with employment of the semiconductor element, such an overvoltage protection circuit is known as disclosed in Japanese Laid-open Patent Application No. 50-36942 such that the output semiconductor element connected to the power supply is prevented from being destroyed when an overvoltage happens to occur in the power supply. Then, the output semiconductor element is forcibly conducted by the break down current of the zener diode, and this overvoltage is absorbed in the load of the output semiconductor element.

However, when such a conventional overvoltage protection circuit is applied to the two-terminal type (DC source connecting terminal and load connecting terminal) drive apparatus for turning ON/OFF the N-channel power transistor employed as a so-called "high-side switch" in the current path from the DC source to the load, the power transistor is turned ON/OFF at a preselected frequency during the occurrence of overvoltages and then this power transistor is overheated. In the worst case, there is such a risk that the power transistor would be thermally destroyed. This conventional problem will now be explained more in detail.

First, as shown in FIG. 8, for instance, the two-terminal type drive apparatus for driving the N-channel power transistor 86 series-connected to the current path from the battery 80 to the load 82 together with the main switch 84, is comprised of the auxiliary power source 92. This auxiliary power source 92 supplies power to the internal control circuit 88 and the drive circuit 90 and the like by charging the power source capacitor C10 via the diode D10 by the voltage appearing both terminals (source-to-drain) of the power transistor 86 when the main switch 84 is under the ON state and the power transistor 86 is under the OFF state, and also by the electron charges stored in this power source capacitor C10, and the voltage across the terminal of the power transistor 86.

Accordingly, when the above-described conventional overvoltage protection circuit is applied to the two-terminal type drive apparatus, this overvoltage protection circuit may be arranged, as indicated by reference numeral 94 of FIG. 8, zener diodes ZD11 to ZD13 which become conductive when the power source voltage Vc outputted from the auxiliary power source 92 reaches a predetermined upper limit voltage. Furthermore, this overvoltage protection circuit is arranged by the protection transistor TR15 for compulsorily turning ON the drive transistor TR16 provided in the drive circuit 90, thereby turning ON the power transistor 86, and also by resistors R51 and R52 for turning ON the protection transistor TR15 (namely, power transistor is turned ON) by the break down currents flowing through the zener diodes ZD11 to ZD13.

It should be noted in the drive apparatus of FIG. 8 that the drive circuit 90 for turning ON/OFF the power transistor 86 is so constructed to turn ON the power transistor 86 by applying the power source voltage Vc via the resistors R14 and R15 to the gate of the power transistor 86 when the drive transistor TR16 turned ON/OFF in response to the control signal derived from the control circuit 88 is brought into the OFF state. Furthermore, the drive apparatus is provided with the overvoltage protection zener diode ZD14 which limits the gate voltage of the power transistor 86 less than a preselected voltage when the power supply voltage Vc becomes abnormal (overvoltage).

In the overvoltage protection circuit 94 with the above-explained circuit arrangement, when the main switch 84 is under the ON-state, and also the power transistor 86 is under the OFF-state, the voltage VB of the battery becomes overvoltage. If the terminal voltage (power supply voltage Vc) of the power supply capacitor C10 power-supplied by the battery 80 exceeds the break voltages of the zener diodes ZD11 to ZD13, then the protection transistor TR15 is turned ON whereby the power transistor 86 is compulsorily turned ON.

When the power transistor 86 is turned ON during the occurrence of overvoltage, the current flows from the battery 80 via the power transistor 86 and the main switch 84 to the load 84, so that the terminal voltage of the load 82, namely the ground potential KG of the drive apparatus is substantially equal to such a voltage obtained by subtracting the ON-voltage of the power transistor 86 from the voltage VB of the battery 80. At this time, the power supply voltage Vc within the drive apparatus corresponds to the voltage across the terminals of the power supply capacitor C10 of the auxiliary power supply 92 on the basis of the ground potential KG. Then, under this condition, since the potential at the positive polarity of the power supply capacitor C10 becomes higher than that of the battery 80, no charging operation to the power supply capacitor C10 from the battery 80 is carried out, and then the power supply voltage Vc is immediately lowered by the discharging operation from the power supply capacitor C10 to the control circuit 88 and the overvoltage protection circuit 94. In response to lowering of this power supply voltage Vc, the protection transistor TR11 employed in the overvoltage protection circuit 94 is turned OFF and the power transistor 86 is also brought into the OFF state. Then, when the power transistor 86 is turned OFF, since the battery voltage VB being equal to the overvoltage is again applied to the power supply capacitor C10, the power supply voltage Vc is increased. As a result, the overvoltage protection circuit becomes active and the power transistor 86 is turned ON.

In other words, as described above, when the conventional overvoltage protection circuit is applied to the two-terminal type drive apparatus, the drive apparatus is operated as the oscillator circuit, and the power transistor is periodically turned ON/OFF.

Then, at this time, the oscillating frequency is determined by the junction capacitances of the zener diodes ZD11 to ZD13 and the capacitance of the power supply capacitor C10, normally becomes several hundreds KHz. For instance, when the overvoltage happens to occur for a long time period due to load dumping, this drive apparatus will repeatedly oscillate.

On the other hands, the operating frequency of the drive circuit 90 shown in FIG. 8, is determined based upon the resistors R14, R15 and the gate capacitance of the power transistor 86, so that when the protection transistor TR15 is turned ON/OFF at the above-described oscillating frequency, the gate voltage becomes stable at the intermediate potential defined between the voltage when the protection transistor TR15 is turned ON and the voltage when the protection transistor TR15 is turned OFF. As a result, the power transistor 86 cannot be driven in such a perfect saturation region where the internal resistance of this transistor 86 becomes minimum, and thus the power transistor 86 would be fixed in such a saturation region that the power transistor 86 is under the half-ON state.

As a consequence, when the overvoltage is produced for a long time period, loss in the power transistor 86 is increased with respect to the load current, and the heat dissipation of the transistor 86 is increased. In the worst case, the power transistor 86 would be thermally destroyed.

The present invention has been made in an attempt to solve the above-described problems, and therefore has a secondary object to provide such an overvoltage protection circuit that is, this overvoltage protection circuit can prevent a power transistor from being destroyed under such a condition that while driving the power transistor employed as the high-side switch in a current path from a DC power source to a load by a two-terminal type drive apparatus, when an overvoltage happens to occur in the DC power source, the power transistor can be surely turned ON without operating the drive apparatus as an oscillating circuit.

To achieve the above-described secondary object, an overvoltage protection apparatus according to a second aspect of the invention is characterized in the above-described load drive apparatus that the current path owns a DC power source connecting terminal and a load connection switch for connecting the load and the load connecting terminal is provided with the load connecting terminal. This overvoltage protection apparatus is employed in a load drive apparatus equipped with an auxiliary power source connected parallel to the power transistor, for storing electron charges into a power supply capacitor by a voltage appearing across terminals of the power transistor, and for producing a power supply voltage by the electron charges stored in the power supply capacitor and the voltage across both terminals of the DC power source connection and the load connection; and a load circuit operated by receiving the supply of power from the auxiliary power source, for turning ON/OFF the power transistor in response to a control signal externally inputted, thereby to drive the load. The overvoltage protection apparatus comprises: overvoltage judging means for making such a judgement that an overvoltage happens to occur in the DC power source when the power source voltage applied from the auxiliary power source exceeds a predetermined judging voltage; judging voltage setting means for setting the judging voltage to a first judging voltage unless the overvoltage judging means judges the occurrence of the overvoltage, and for setting the judging voltage to a second judging voltage lower than the first judging voltage by a preselected voltage when the overvoltage judging means judges the occurrence of the overvoltage, and thereafter until the overvoltage judging means judges the occurrence of the overvoltage; and protection means for turning ON the power transistor when the overvoltage judging means judges the occurrence of the overvoltage.

In the overvoltage protection apparatus with the above-described arrangement, according to the second aspect of the present invention, the overvoltage judging means judges that an overvoltage happens to occur in the DC power source when the power supply voltage of the auxiliary power source exceeds a predetermined judging voltage. When this overvoltage judging means judges the occurrence of the overvoltage, the protection means turns ON the power transistor. The judging voltage in the overvoltage judging means is set to the first judging voltage by the judging voltage setting means unless the overvoltage judging means judges the occurrence of the overvoltage. When the occurrence of the overvoltage is judged by the overvoltage judging means, the judging voltage setting means sets the judging voltage to a second judging voltage lower than the first judging voltage by a preselected voltage after the overvoltage judging means does not judge the occurrence of the overvoltage.

In other words, in accordance with the second aspect of the present invention, a so-called "hystereis characteristic" is provided in the judging voltage of the overvoltage judging means. When the overvoltage of the DC power source is judged by the overvoltage judging means, the voltage used to judge the voltage is subsequently changed into the second judging voltage lower than the normal judging voltage (first judging voltage). As a result, the time period defined after the power transistor has been turned ON and until the power supply voltage of the auxiliary power source is lowered to turn OFF the-power transistor may be prolonged, so that the power transistor is turned ON/OFF at high-speed when the overvoltage is produced in the DC power source.

As a consequence, according to the second aspect of the present invention, the power transistor can be surely protected without such a conventional problem that when the overvoltage happens to occur in the DC power source, the power transistor is turned ON/OFF at high speeds and therefore is overheated, as in the conventional load drive apparatus.

In addition, the inventors of the present invention have considered the thermal destroy of the power transistor with respect to the above-described load drive circuit.

That is, in the above-described two-terminal type load drive apparatus, when the main switch (direction indicator switch) is turned ON, there is substantially no potential difference between the terminals of the power transistor. Accordingly, even in such a condition, the auxiliary power source is required which employs the power supply capacitor used to operate the drive circuit for driving the power transistor.

However, the auxiliary power source voltage of the auxiliary power source is lowered when the voltage produced across the terminals of the power transistor is lowered in case that this power transistor corresponding to the switching element is turned OFF, namely when the output voltage of the DC power source is lowered in order to produce the power supply voltage by utilizing the output voltage of the DC power source. As a result, when the output voltage of the DC power source is lowered, the power transistor is brought into the low voltage drive condition. There is no problem if the drive voltage of the power transistor is the drivable voltage within the saturation region where the internal resistance of the power transistor becomes minimum. When the drive voltage is so lowered, the internal resistance is increased, so that the heat dissipation is increased, resulting in thermal destroy.

A third object of the present invention is therefore to provide such a load drive apparatus when the output voltage of either the DC power source, or the auxiliary power source is lowered, that the driving operation of the power transistor is stopped to suppress the heat dissipation of the power transistor, and then the heat destroy of the power transistor can be prevented.

To achieve the above-explained third object, a third aspect of the present invention is featured such that in the above-described load drive apparatus, output voltage detecting means for the DC power source, or the auxiliary power source is employed, and this output voltage detecting means includes second drive stopping means for stopping the driving operation of the power transistor when the output voltage of either the DC power source, or the auxiliary power source is lowered.

In accordance with the load drive apparatus with the above-explained third aspect of the present invention, when the output voltage of the DC power source is lowered, lowering of this output voltage is detected by the output voltage detecting means and then the driving operation of the power transistor is stopped.

As a consequence, it can be prevented that the power transistor is driven under such a low voltage that the internal resistance thereof becomes large. As a consequence, such a thermal destroy can be prevented which is caused by the heat dissipation of the power transistor driven under the low voltage.

BRIEF DESCRIPTION OF THE DRAWINGS

For a better understanding of the present invention, reference is made of the detailed description to be read in conjunction with the accompanying drawing in which.

DETAILED DESCRIPTION OF THE PREFERRED EMBODIMENTS

Figure 1:
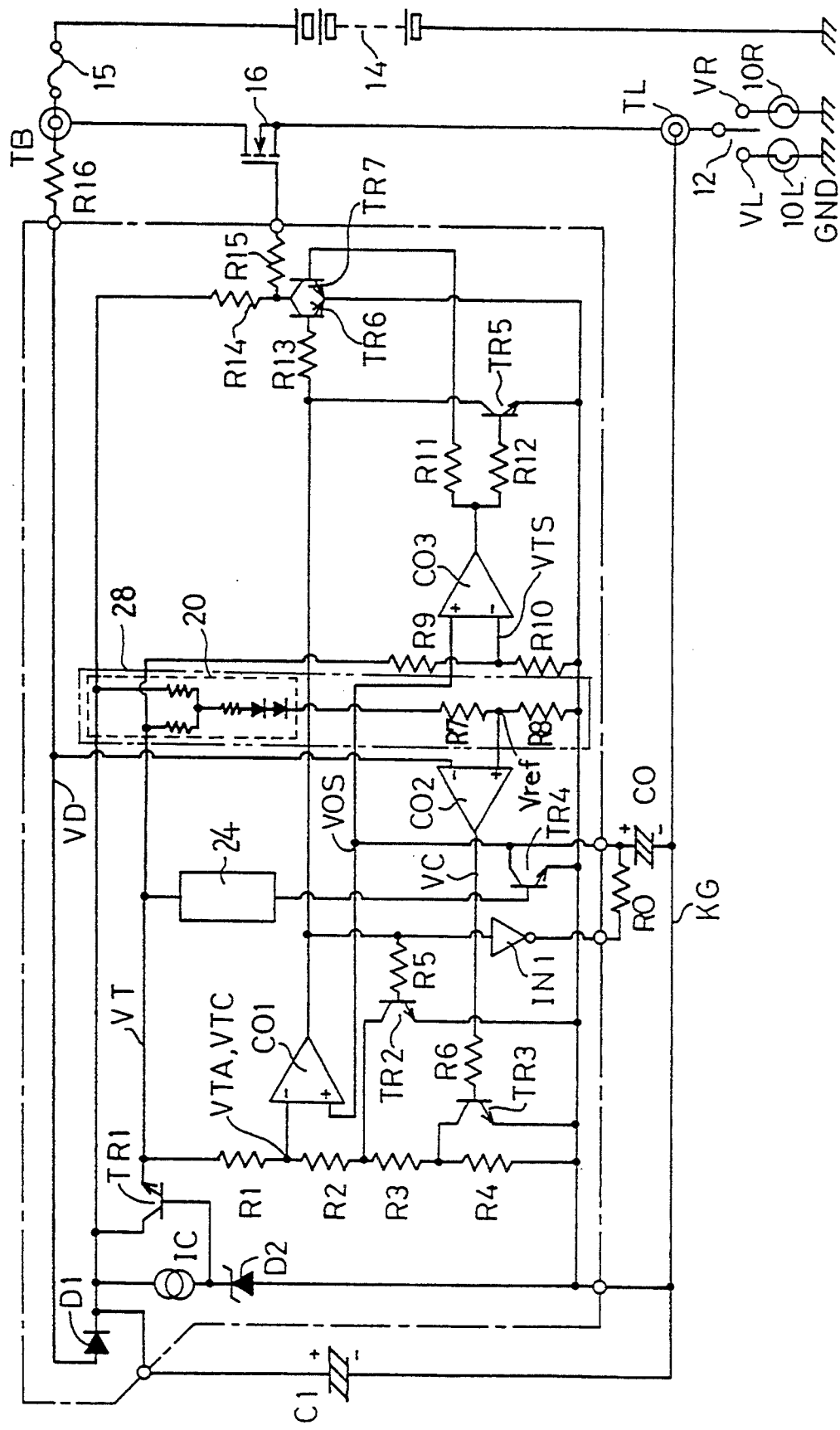
FIG. 1 is a circuit diagram of a load drive apparatus according to a first embodiment of the present invention.

Referring now to the drawings, a load drive apparatus according to an embodiment of the present invention will be described.

Figure 2:
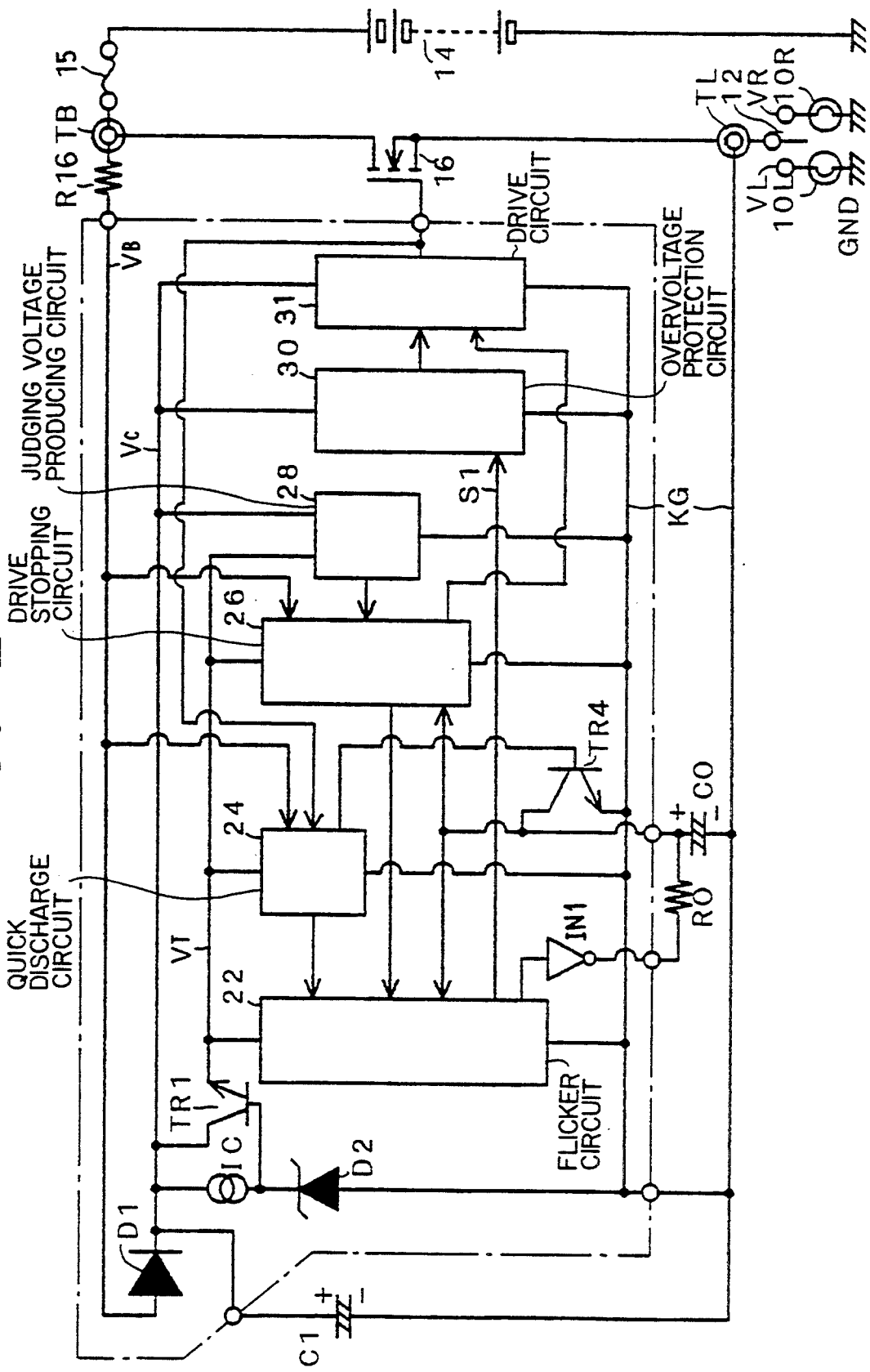
FIG. 2 schematically represents a circuit diagram of a load drive apparatus on which all of embodiments of the present invention have been mounted.

FIG. 2 schematically represents an overall circuit arrangement of a direction indicator apparatus for a vehicle, to which the present inventive idea has been applied. FIG. 1 shows a circuit diagram of a power MOSFET overcurrent protection circuit employed in this direction indicator apparatus, in which the power MOSFET corresponds to one of the power transistors.

As represented in FIG. 2, the vehicle direction indicating apparatus according to a first embodiment of the present invention, is comprised of direction indicating lamps 10L, 10R which are provided on the left and right sides of the vehicle, respectively; a direction indicating switch 12 operated by a car driver, if necessary, so as to turn ON any one of these direction indicating lamps 10L, 10R; and an N-channel power MOSFET 16. The N-channel power MOSFET 16 is provided in a current path constructed of the direction indicating switch 12, a fuse 15 and a battery 14, through which power of the battery 14 is supplied to the direction indicating lamps 10L and 10R. Any one of the direction indicating lamps 10L and 10R, which is connected by the direction indicating switch 12, is flickered by periodically conducting and disconnecting this current path when the direction indicating switch 12 is turned ON. To conduct/disconnect this current path, the drain of the power MOSFET 16 is connected via a terminal TB to the battery 14, and the source thereof is connected via a terminal TL to the direction indicating switch 12.

An auxiliary power source constructed of a resistor R1, a diode D1, and a power supply capacitor C1 is connected between the terminals TB and TL, to which the power MOSFET 16 is connected, and this auxiliary power source is connected in parallel to the power MOSFET 16.

This auxiliary power source charges the power supply capacitor C1 by a voltage substantially equal to the output voltage of the battery 14 produced between the terminals TB and TL under such a condition that the direction indicating switch 12 is turned ON to connect the terminal TL to any one of these direction indicating lamps 10L and 10R, and furthermore the power MOSFET 16 is turned OFF. This voltage produced between the terminals is applied to this load drive apparatus as a power supply voltage. When the power MOSFET 16 is brought into the ON-state, whereby the voltage between the terminals TB and TL, the voltage across the power supply capacitor C1 is applied to the load drive apparatus as the power supply voltage.

To the power supply capacitor C1, a constant voltage circuit arranged by a constant current circuit IC, a zener diode D2 and a transistor TR1 is connected. Based upon the constant voltage outputted from this constant voltage circuit, various reference voltages may be produced which are used to ON/OFF-control the power MOSFET 16.

On the other hand, there are provided in this vehicle direction indicating apparatus of this embodiment, a drive circuit 31 for driving the power MOSFET 16; an integrating circuit constructed of a charging/discharging capacitor C0 and a resistor R0; and a flicker circuit 22 for producing a flicker signal S1 as the above-described control signal. The direction indicating lamps 10L and 10R is flickered by charging/discharging the charging/discharging capacitor C0 by applying the charging/discharging control voltage via an invertor IN1 to the integrating circuit when the direction indicating switch 12 is turned ON. The vehicle direction indicating apparatus further includes a quick discharging circuit 24 for quickly discharging the charging/discharging capacitor C0 by detecting that the direction indicating switch 12 is turned OFF and the transistor TR2 is turned ON; an overcurrent judging means as defined in the first aspect of the present invention, corresponding to a circuit for preventing that an overcurrent flows through the power MOSFET 16 by detecting this overcurrent flowing through the power MOSFET 16, whereby the flicker operation of the direction indicating lamps 10L and 10R by the flicker circuit 22 is prohibited. The vehicle direction indicating apparatus furthermore includes a drive stopping circuit 26 having an upper voltage changing means, a drive stopping means; a judging voltage producing circuit 28 for producing the judging voltage of the overcurrent judging means within the drive stopping circuit 26; an overvoltage judging means as defined in the second aspect of the present invention, which detects an extraordinary condition (overvoltage) of the battery voltage VB from the power supply voltage Vc applied from the auxiliary power source, thereby compulsorily turning ON the power MOSFET 16; and an overvoltage protection circuit 30 having a judging voltage setting means and a protection means.

It should be noted that the flicker circuit 22 is known in the art, and repeatedly charges/discharges the charging/discharging capacitor C0 in accordance with the below-mentioned sequence, and produces a flicker signal S1 having a LOW level for turning ON the power MOSFET 16 during the charging operation. That is, the constant voltage VT obtained from the constant voltage circuit is subdivided to produce an upper limit voltage and a low limit voltage of the charging/discharging capacitor C0, and the output of the invertor IN1 is set to a HIGH level until the voltage across the terminals of the charging/recharging capacitor C0 reaches the upper limit voltage, so that the charging-/discharging capacitor C0 is charged at a preselected time constant. When the voltage across the terminals of the charging/recharging capacitor C0 reaches the upper limit voltage, the output from the invertor IN1 is set to the LOW level while this terminal voltage subsequently reaches the lower limit voltage, so that the charging/discharging capacitor C0 is discharged at a predetermined time constant.

The contents of the above-explained drive stopping circuit 26, judging voltage producing circuit 28, overvoltage protection circuit 30, drive circuit 31, and quick discharging circuit 24 will be described in tern more in detail.

[FIRST EMBODIMENT]

First, in FIG. 1, there is shown the invention defined by the first aspect, namely, a load drive apparatus equipped with an overcurrent protection circuit according to a first embodiment of the present invention.

FIG. 1 represents more in detail the internal circuit arrangements of the flicker circuit 22, the drive stopping circuit 26, and the judging voltage producing circuit 28 among the circuits shown in FIG. 2. It should be understood that the same reference numerals shown in FIG. 2 will be employed as those for denoting the same circuit elements of FIG. 1, and similarly in the following drawings.

Then, as the flicker circuit 22 shown in FIG. 2, the vehicle direction indicating apparatus according to this embodiment is equipped with a charging/discharging circuit. This charging/discharging circuit is arranged by an integrating circuit constructed of the charging-/discharging capacitor C0 and the resistor R0; dividing resistors R1, R2, R3, R4 for subdividing the output voltage VT obtained from the constant voltage circuit to produce various reference voltages; and a comparator CO1 for comparing the voltage VOS across the terminals of the charging/discharging capacitor C0 with the reference voltages produced from these resistors R1 to R4 to produce a signal with a HIGH level when the voltage VOS across the terminals of the charging/discharging capacitor C0 becomes higher than the reference voltage. This charging/discharging circuit further includes an invertor IN1 for inverting the output signal derived from the comparator CO1 to supply the inverted signal to the integrating circuit; and a transistor TR2 for receiving the output of the comparator CO1 via a resistor R5 at its base, and for grounding a junction point between the subdividing resistor R2 and R3 when the output from the comparator CO1 becomes the HIGH level.

Normally, the junction point between the subdividing resistors R3 and R4 is earthed via a transistor TR3 functioning as the reference voltage changing means. In this charging/discharging circuit, the upper limit voltage VTA and the lower limit voltage VTC are usually produced by the resistors R1 to R3 when the capacitor is charged and discharged, so that the charging/discharging capacitor C0 is charged and discharged.

In other words, the output from the comparator CO1 becomes a low level until the voltage VOS across the terminals of the charging/discharging capacitor C0 reaches the upper limit voltage $VTA = VT(R2+R3)/(R1+R2+R3)$ obtained by subdividing the output voltage VT derived from the constant voltage circuit by the resistor R1, and the resistors R2 and R3, during which the charging/discharging capacitor C0 is charged via the register R0 by the signal with the high level outputted from the invertor IN1.

Then, when the voltage VOS across the terminals of the charging/discharging capacitor CO reaches the upper limit voltage VTA, the level of the output from the comparator CO1 is inverted into the high level, and thus the electron charges stored in the charging/discharging capacitor C0 is discharged via the resistor R0 to the invertor IN1.

At this time, since the output of the comparator CO1 is the high level, the transistor TR2 is turned ON, and the reference voltages inputted into the comparator CO1 are switched to the lower limit voltage $VTC = VT \times R2/(R1+R2)$ obtained by subdividing the output voltage VT derived from the constant voltage circuit by way of the resistors R1 and R2.

As a result, during such a time period that after the voltage VOS across the terminals of the charging/discharging capacitor C0 has once reached the upper limit voltage VTA, and this terminal voltage VOS becomes the lower limit voltage VTC, the signal level of the output from the comparator CO1 becomes a high level and then the discharging operation of the charging/discharging capacitor C0 is continued.

Thereafter, when the voltage VOS across the terminals of the charging/discharging capacitor C0 reaches the lower limit voltage VTC, the signal level of the output from the comparator CO1 is changed into the low level, and also the reference voltage entered into the comparator CO1 is changed into the upper limit voltage VTA.

As a result, when the voltage VOS across the terminals of the charging/discharging capacitor C0 reaches the lower limit voltage VTC due to the discharging operation, the charging/discharging capacitor C0 is again charged until this terminal voltage VOS reaches the upper limit voltage VTA.

Subsequently, the output from the comparator CO1 is inputted as a drive signal for turning ON/OFF the power MOSFET 16 into a transistor TR6 used to constitute the drive circuit of the power MOSFET 16. In other words, this signal entered into the transistor TR6 corresponds to a flicker signal S1 shown in FIG. 2, FIG. 5 or FIG. 7. This signal is similarly applied to other embodiments. The transistor TR6 receives at its base the output signal derived from the comparator CO1 via a resistor R13, and is brought into the ON-state when this output signal is at a high level, whereby the power supply voltage applied from the auxiliary power source is applied to the gate of the power MOSFET 16 from a junction point between a resistor R14 and a resistor R15, which is earthed.

That is to say, the transistor TR6 causes the power MOSFET 16 to be turned ON during the charging operation of the charging/discharging capacitor C0 in which the output level of the comparator CO1 becomes the low level, whereas the transistor TR6 causes the power MOSFET 16 to be turned OFF during the discharging operation of the charging/discharging capacitor C0 in which the output level of the comparator CO1 becomes the high level, so that the power MOSFET 16 is periodically turned ON/OFF in response to the outputs from the comparator CO1.

Also, there is provided in this vehicle direction indicating apparatus according to this embodiment, another comparator CO2 functioning as the overcurrent judging means. This comparator CO2 fetches a voltage (will be referred to an "ON-voltage" hereinafter) "VD" corresponding to the source-to-drain voltage VDS of the power MOSFET 16, and makes a decision whether or not an overcurrent flow through the power MOSFET 16 by checking as to whether or not this ON-voltage VD exceeds an overcurrent judging voltage Vref.

It should be noted that the overcurrent judging voltage Vref may be set to a proper value determined by an overcurrent judging voltage producing circuit constructed of a load current detecting circuit 20, a resistor R7, and a resistor R8 based on the user conditions of the power MOSFET 16, i.e., the power supply voltage and the temperature.

In other words, the load current detecting circuit 20 synthesizes the output voltage VT derived from the constant voltage circuit with the power supply voltage proportional to the battery voltage derived from the auxiliary power source, thereby to produce a voltage which corresponds to the load current flowing thorough the direction indicating lamp 10L or 10R when the power MOSFET 16 is turned ON. Furthermore, this load current detecting circuit 20 produces the overcurrent judging voltage Vref corresponding to the overcurrent which flows under the respective power supply voltages and the respective temperatures when the power MOSFET 16 is turned ON, by subdividing this produced voltage by the register R7 and the resistor R8, because this produced voltage has been corrected to be fitted to such a voltage corresponding to the temperature characteristic of the power MOSFET 16 by way of a diode.

Then, the overcurrent judging comparator CO2 will output a judging signal VC with a high level so as to turn ON the transistor TR3 when the power MOSFET 16 is normally operated and the ON-voltage VD is below the overcurrent judging voltage Vref. The overcurrent judging comparator CO2 will outputs another judging signal VC having a low level so as to turn OFF the transistor TR3 when such a judgement is made that the ON-voltage VD exceeds the overcurrent judging voltage Vref and the overcurrent flows through the power MOSFET 16.

As a result, as previously stated, normally, the upper limit voltage VTA is inputted to the comparator CO1 as the reference voltage for the charging operation of the charging/discharging capacitor C0. When the comparator CO2 judges that the overcurrent flows through the power MOSFET 16, a second upper limit voltage $VTB=VT(R2+R3+R4)/(R1+R2+R3+R4)$ which is greater than the upper limit voltage VTA is entered into the comparator CO1. As a consequence, when the overcurrent flows the power MOSFET 16, the charging/discharging capacitor C0 is charged up to the second upper limit voltage VTB which exceeds the normal upper limit voltage VTA by way of the comparison operation by the comparator CO1.

Then, the vehicle direction indicating apparatus according to this embodiment further comprises a comparator CO3 functioning as the drive stopping means, for comparing the voltage VOS across the terminals of the charging/discharging capacitor C0 which is charged/discharged in the above-described manner with a drive stop judging voltage VTS which is produced by the resistors R9 to R10 used to subdivide the output voltage VT derived from the constant voltage circuit, and which is more or less lower than the above-described second upper limit voltage VTB. The comparator CO3 outputs a signal with a high level when the voltage VOS across the terminals of the charging/discharging capacitor C0 is higher than this drive stop judging voltage VTS. This vehicle direction indicating apparatus further includes a resistor R11 and a transistor TR7 for compulsorily turning OFF the power MOSFET 16 by grounding the gate of the power MOSFET 16 via the resistor R15 when the output signal derived from this comparator CO3 is at the high level; and a resistor R12 and a transistor TR5 for compulsorily setting the output of the comparator CO1 to the low level by grounding a drive signal path of the power MOSFET 16 which is defined from the comparator CO1 via the resistor R13 to the base of the transistor TR6 when the output signal derived from the comparator CO3 is similarly at the high level.

As a consequence, when it is judged that the overcurrent flows through the power MOSFET 16 from the comparator CO2, the charging/discharging capacitor C0 is charged to a voltage exceeding the normal upper limit voltage VTA, and then the voltage across the terminals of this capacitor C0 reaches the drive stop judging voltage VTS, the power MOSFET 16 is turned OFF and the output of the comparator CO1 is held at the low level. After the power MOSFET 16 has been turned OFF, the charging/discharging capacitor 10 is continuously charged.

The vehicle direction indicating apparatus according to this embodiment further includes a quick discharging transistor TR4 connected parallel to the charging/discharging capacitor C0; and a quick discharging circuit 24 for quickly discharging the charging/discharging capacitor C0 by turning OFF this transistor TR4 when the output voltage VT derived from the constant voltage circuit is lowered to a predetermined level in connection with lowering of the power supply voltage.

This quick discharging circuit 24 owns such a function. That is, when the direction indication switch 12 is turned OFF, and the power supply voltage supplied from the auxiliary power source is lowered, so that this apparatus cannot be operated under the normal condition, the charging/discharging capacitor C0 is quickly discharged. As a result, the electron charges stored in this capacitor C0 are discharged to zero, whereby the charging operation of the charging/discharging capacitor C0 is commenced from the initial condition when the direction indicating switch 12 is turned ON, and thus the direction indicating lamp 10L or 10R is flickered in a constant time period just after the direction indicating switch 12 is turned ON. It should be noted that the operation of the quick discharging circuit 24 will be described more in detail in a fifth embodiment and the subsequent embodiments.

It should also be noted that the circuit portions surrounded by a dot and dash line among the circuit arrangement for constituting the vehicle direction indicating apparatus of the embodiment, except for the power MOSFET 16, the resistor R16, the integrating circuit constructed of the resistor R0 and the charging/discharging capacitor C0, and the power supply capacitor C1, are stored within a single IC package. In FIG. 1, symbol "VR" indicates a voltage across terminals of the direction indicating lamp 10R, and symbol "VL" denotes a voltage across terminals of the direction indicating lamp 10L, respectively.

Figure 3:
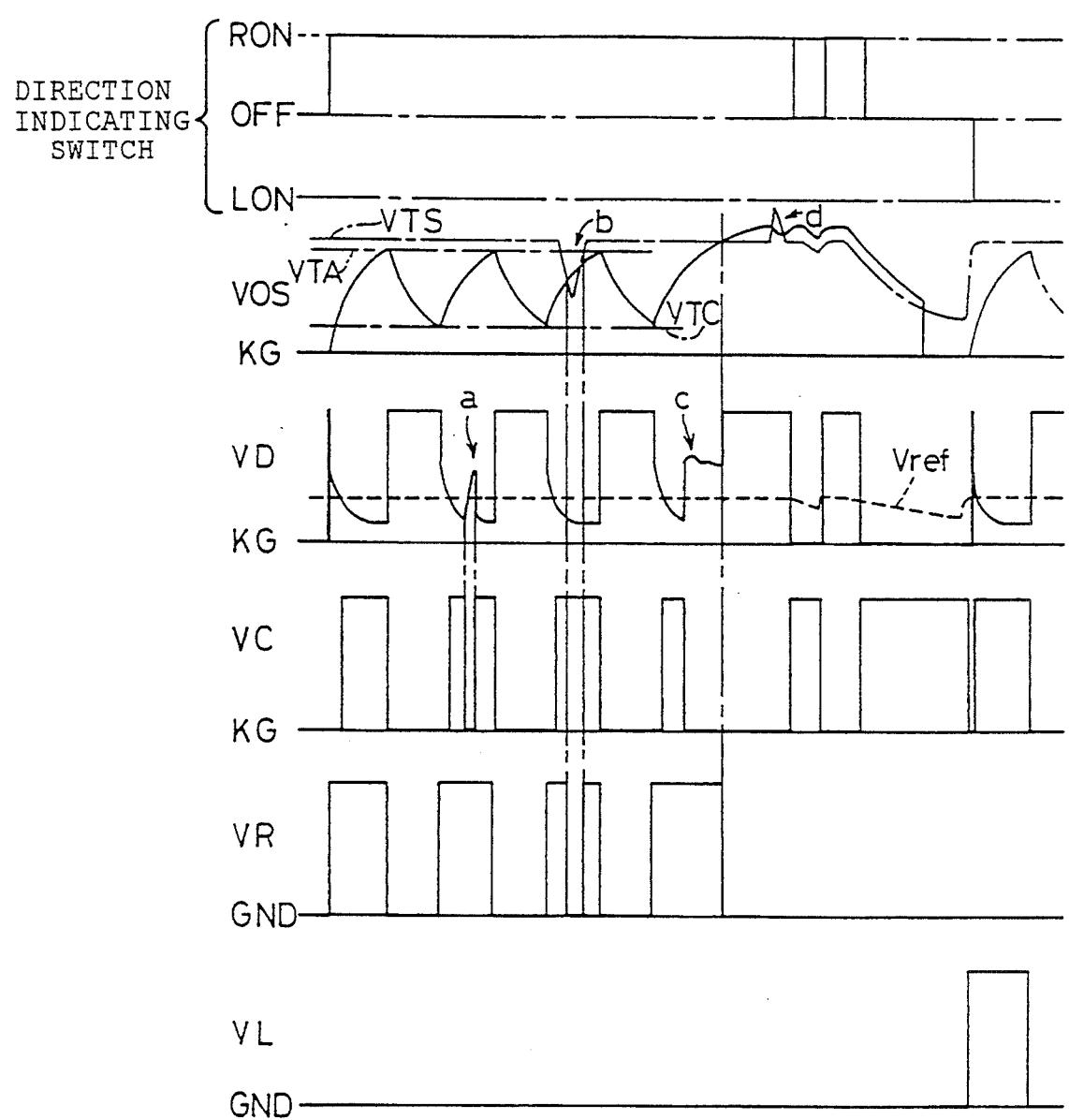
FIG. 3 is a time chart for indicating operations of the load drive apparatus shown in FIG. 1.

Next, a description will now be made of operations of the vehicle direction indicating apparatus with the above-described circuit arrangement according to the first embodiment with reference to a time chart shown in FIG. 3. In FIG. 3, reference symbols VOS, VD, VC, VR and VL represent voltages appearing at the various circuit portions of FIG. 1.

As represented in FIG. 3, when the direction indicating switch .12 is switched to turn ON the direction indicating lamp 10R by a car driver, and therefore is brought into the ON-state (RON), the charging/discharging operations of the charging/discharging capacitor C0 is commenced by the charging/discharging circuit made of the comparator CO1, the transistor TR2, the invertor IN1 and the like. The power MOSFET 16 is turned ON/OFF via the transistor TR6 in response to the output of the comparator CO1 to flicker the direction indicating lamp 10R.

Here, although the ON-voltage of the power MOSFET 16 exceeds the overcurrent judging voltage Vref due to the rash current, and the judging signal VC outputted from the comparator CO2 becomes the low level which indicates that the overcurrent flows through the power MOSFET 16 when the direction indicating lamp 10R is started to be turned ON, since the voltage VOS across the terminals of the charging-/discharging capacitor C0 does not reach the drive stop judging voltage VTS, the power MOSFET 16 is not turned OFF in response to the output derived from the comparator CO3. Also, since the rush current is attenuated after several tens msec., the output of the comparator CO2 is immediately returned to such a high level which represents that the power MOSFET 16 is normally operated, so that no adverse influence is given to the flicker operation of the direction indicating lamp 10R.

Moreover, when the power MOSFET 16 is turned OFF during the flicker operation of the direction indicating lamp 10R, since the source-to-drain voltage VDS of the power MOSFET 16 becomes equal to the battery voltage, the judging signal VC outputted from the comparator CO2 has such a low level which indicates that the overcurrent flows through the power MOSFET 16. At this time, since the charging/discharging capacitor C0 is under discharging operation, the voltage VOS across the terminals of the charging/discharging capacitor C0 is not increased higher than the drive stop judging voltage VTS, but also the power MOSFET 16 is not turned OFF by the comparator CO3.

As indicated by an arrow "a" of FIG. 3, even when the ON-voltage VD exceeds the overcurrent judging voltage Vref due to noise while the direction indicating lamp 10R is turned ON, since the voltage VOS across the terminals of the charging/discharging capacitor C0 does not become higher than the drive stop judging voltage VTS, the power MOSFET 6 is not turned OFF by the comparator CO3.

As shown in an arrow "b" of FIG. 3, there are some cases that the output of the comparator CO3 becomes a high level due to noise, and then the power MOSFET 16 is turned OFF. In this case, since the noise disappears and the output from the comparator CO3 is returned to the low level, the power MOSFET 16 is under the latch state and is not latched.

On the other hand, as illustrated by an arrow "c" of FIG. 3, when the overcurrent continuously flows during the ON-operation of the power MOSFET 16, the charging/discharging capacitor C0 is charged to such a voltage exceeding the upper limit voltage VTA by the operations of the comparator CO2, the transistor TR3, the comparator CO1 and the inverter IN1. At a time instant when the voltage across the terminals of the charging/discharging capacitor C0 becomes higher than the drive stop judging voltage VTS due to this charging operation, the comparator CO3 turns OFF the power MOSFET 16. In other words, in accordance with this embodiment, when the overcurrent flows during the ON-state of the power MOSFET 16, the ON-state of the power MOSFET 16 is continued for such a charging time period as a delay time that the voltage VOS across the terminals of the charging/discharging capacitor C0 reaches the drive stop judging voltage VTS from the upper limit voltage VTA. After this delay time, the power MOSFET 16 is switched from the ON-state into the OFF-state.

At this time, since the comparator CO3 holds the output of the comparator CO1 at the low level, the charging/discharging capacitor C0 is discharged until the voltage VOS across the terminal of this capacitor C0 reaches the output level of the inverter IN1. As a consequence, when the overcurrent flows through the power MOSFET 16, after the comparator CO3 turns OFF the power MOSFET 16, this condition is maintained.

As described above in this embodiment, if the overcurrent flows through the power MOSFET 16 while this power MOSFET 16 is turned ON, then the charging/discharging capacitor C0 is charged up to the voltage higher than the drive stop judging voltage VTS. Since such a delay time defined after the judgement of the overcurrent up to turning OFF of the power MOSFET 16 is set, even when the power MOSFET 16 is continuously turned ON for the time period defined by adding the turn-ON time of the direction indicating lamps 10L and 10R to this delay time, this power MOSFET 16 can sufficiently sustain thermal conditions. In case that such an overcurrent happens to occur by which the power MOSFET 16 may be instantaneously destroyed, since the fuse 15 is melt down, this power MOSFET 16 is not destroyed.

Subsequently, as shown by an arrow "d" of FIG. 3, if the drive stop judging voltage VTS entered into the comparator CO3 becomes higher than the voltage VOS across the terminals of the charging/discharging capacitor C0 due to noise when the comparator CO3 causes the power MOSFET 16 to be turned OFF, then the output of the comparator CO3 temporarily becomes the low level, and thus the transistors TR5 and TR7 are turned OFF. However, since the terminal voltage VOS of the charging/discharging capacitor C0 is higher than the second upper limit voltage VTB at this time, the comparator CO1 outputs such a signal with a high level by which the charging/discharging capacitor C0 is discharged up to the lower limit voltage VTC.

As a result, even if the output of the comparator CO3 is temporarily changed into the low level due to noise while the comparator CO3 turns OFF the power MOSFET 16, the power MOSFET 16 is maintained under the OFF-state by the output of the comparator CO1. At this time, the charging/discharging capacitor C0 is discharged by the output of the comparator CO1. However, the noise input time is very short, and when the noise is removed, the output of the comparator CO3 again becomes the high level, so that the terminal voltage VOS of the charging/discharging capacitor C0 is not below the drive sop judging voltage VTS, and the OFF-state of the power MOSFET 16 is surely maintained.

Moreover, the overcurrent flows through the power MOSFET 16, and the terminal voltage VOS of the charging/discharging capacitor C0 becomes lower than the drive stop judging voltage VTS after the comparator CO3 turns OFF the power MOSFET 16. Such a condition occurs when a car driver turns OFF the direction indicating switch 12 and the power supply voltage is lowered, and thereafter the charging/discharging capacitor C0 is quickly discharged by the operations of the quick discharging circuit 24. As a result, even when the car Driver turns ON the direction indicating switch 12 after the comparator CO3 turns OFF the power MOSFET 16 and before the quick discharging circuit 24 is operated, the power MOSFET 16 is not brought into the ON-state. Then, there is no such a risk that the direction indicating switch 12 is repeatedly turned ON, so that the power MOSFET 16 is overheated and then is electronically destroyed.

As previously explained, in the vehicle direction indicating apparatus according to this embodiment, when it is so judged that the overcurrent flows through the power MOSFET 16, the delay time is set by employing the charging/discharging circuit for determining the flicker period of the direction indicating lamp. When it is so judged the overcurrent flows through the power MOSFET 16 during this delay time, the power MOSFET 16 is turned OFF. As a consequence, when the occurrence of the overcurrent is erroneously judged due to the noise, there is no risk that the power MOSFET 16 is turned OFF. Moreover, since no specific delay circuit need be employed, the overall circuit arrangement can be made simple.

After the power MOSFET 16 is turned OFF, the charging/discharging circuit is employed. The OFF-state of the power MOSFET is held while the terminal voltage VOS of this charging/discharging capacitor C0 becomes below the drive stop judging voltage VTS, so that the power MOSFET 16 can be surely turned OFF without receiving any influence of the noise after the power MOSFET 16 has been once turned OFF.

Since the OFF-state of the power MOSFET 16 is released when the quick discharging circuit 24 is operated in connection with lowering of the power supply voltage, even when the direction indicating switch 12 is repeatedly turned ON, which constitutes the power supply switch of this apparatus, after the power MOSFET 16 has been turned OFF, this power MOSFET 16 is not turned OFF every time this switching operation is carried out. Then, it can be prevented that the power MOSFET 16 is destroyed by repeating the turn-ON operation of the direction indicating switch 12. This point will be described more in detail after the fifth embodiment.

[SECOND EMBODIMENT]

In the above-described embodiment, such a vehicle direction indicating apparatus has been explained that the power MOSFET 16 is turned ON/OFF in response to the output from the comparator CO1 for charging/discharging the charging/discharging capacitor C0, thereby to flicker the direction indicating lamps. The present invention may be applied to another drive apparatus such that the power MOSFET. 16 is turned ON/OFF in response to a PWM signal having a predetermined duty ratio, thereby to control a load current of a motor and a lamp. As to this circuit arrangement, a description will now be made with reference to FIG. 4.

Figure 4:
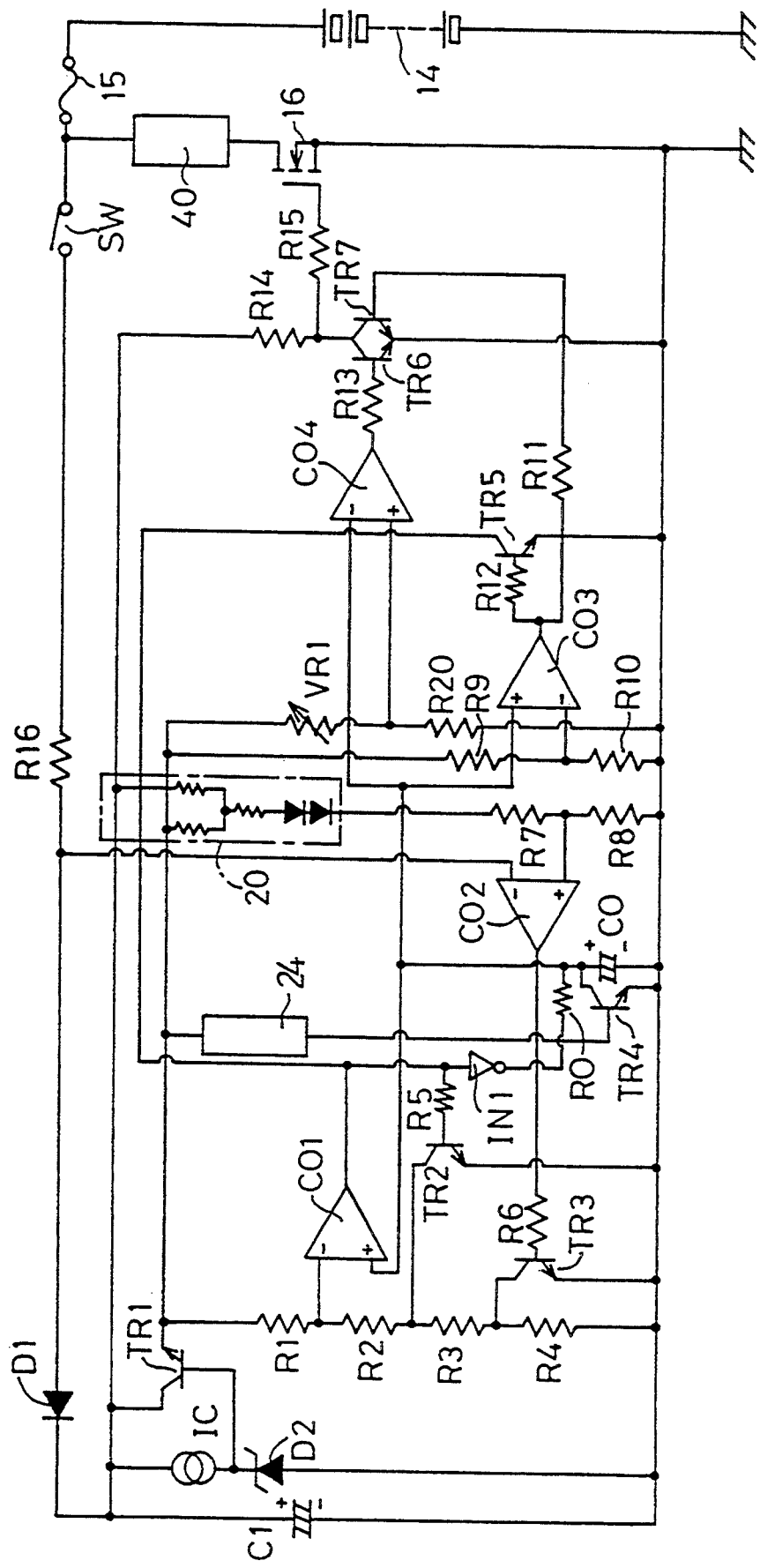
FIG. 4 is a circuit diagram of a load drive apparatus according to a second embodiment of the present invention, corresponding to an alternative example of the first embodiment.

As shown in FIG. 4, in case that a load 40 is PWM-controlled by employing the power MOSFET 16, in addition to the circuit arrangement of the above-described first embodiment, a comparator CO4 is employed. This comparator CO4 compares the terminal voltage of the charging/discharging capacitor C0 with the reference voltage obtained by subdividing the constant voltage from the constant voltage circuit by a variable resistor VR1 and a resistor R20, and produces a signal having a low level when the terminal voltage of the capacitor is higher than, equal to this reference voltage. The output from this comparator CO4 is entered via a resistor R13 to a transistor TR6 for driving the power MOSFET. Other circuit arrangements are similar to those of the above-described first embodiment.

Similar to the above-explained embodiment, in the PWM controlling drive apparatus with the above-described circuit arrangement, the power MOSFET 16 can be preferably protected without any adverse influence by the noise, and also when, for example, a motor is employed as the load 40, the below-mentioned advantages can be furthermore achieved.

That is, it is assumed that when the motor is started to be driven in response to the drive signal having a low duty ratio with a short conducting time, the motor is mechanically locked due to trouble in the mechanical system. At this time, since the source-to-drain voltage VDS of the power MOSFET 16 is increased, the output from the overcurrent judging comparator CO2 becomes a low level, so that the charging/discharging capacitor C0 is continued to be charged, the duty ratio of the drive signal for the power MOSFET 16 becomes 100%, and thus the drive torque of the motor becomes maximum. As a result, in case of such a motor locking phenomenon, the problem in the mechanical system can be automatically solved by the maximum drive torque, and thus the motor locking condition can be released.

It should be noted when either the motor locking phenomenon cannot be released by the drive signal having the duty ratio of 100%, or the overcurrent flows due to malfunction of the electric system, the power MOSFET 16 is turned OFF at a time instant when the terminal voltage VOS of the charging/discharging capacitor C0 becomes higher than the drive stop judging voltage VTS. Accordingly, the power MOSFET 16 can be prevented from being electrically destroyed, and the wiring patterns can be prevented from being damaged.

[THIRD EMBODIMENT]

Figure 5:
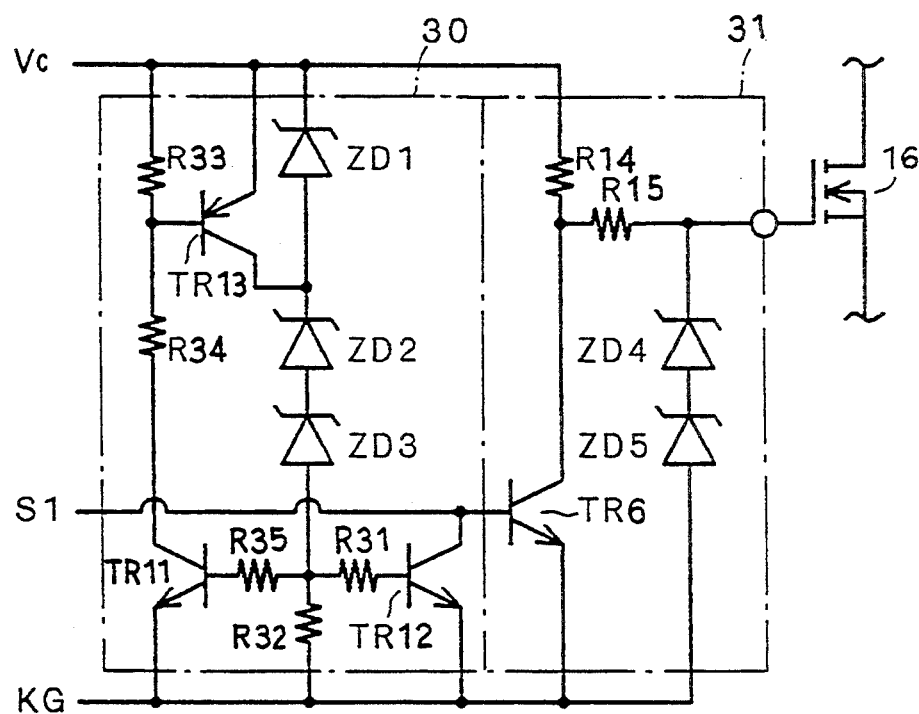
FIG. 5 is a circuit diagram of an overvoltage protection circuit employed in the load drive apparatus of the present invention.

Referring now to FIG. 5, the circuit arrangements of the drive circuit 31 and the overvoltage protection circuit 30 will be described more in detail.

Figure 8:
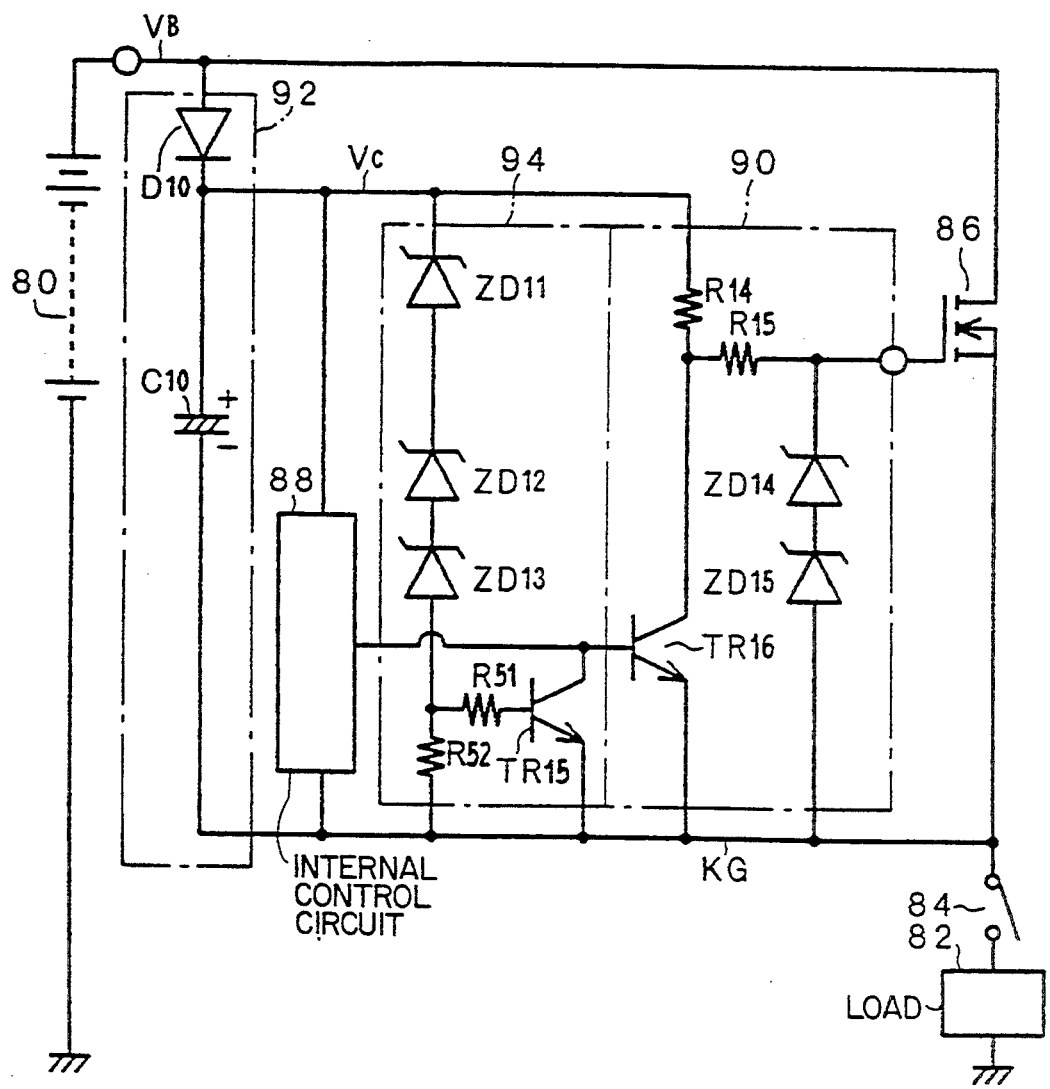
FIG. 8 is a circuit diagram of the conventional overvoltage protection circuit for the load drive apparatus represented in FIG. 5 and FIG. 7.

As shown in FIG. 5, the drive circuit 31 according to this embodiment is so arranged by employing the drive transistor TR6 which is turned ON/OFF in response to the flicker signal S1 outputted from the flicker circuit 22. similar to the conventional apparatus as illustrated in FIG. 8, and that when the drive transistor TR6 is brought in to the OFF state (namely, when the flicker signal S1 is at the low level), the power MOSFET 16 is turned ON by applying the power supply voltage Vc via resistors R14 and R15 to the gate of the power MOSFET 16. Furthermore, this drive circuit 31 is equipped with overvoltage protection zener diodes ZD4 and ZD5 which may limit the gate voltage of the power MOSFET 16 to a voltage less than a predetermined voltage when the power supply voltage Vc becomes abnormal (occurrence of overvoltage).

Next, the overvoltage protection circuit 30 of this embodiment will judge the abnormal condition (overvoltage) of the battery voltage VB based on the power supply voltage Vc applied from the auxiliary power source, and therefore compulsorily turns ON the power MOSFET 16. Similar to the conventional apparatus shown in FIG. 8, this overvoltage protection circuit 30 is comprised of zener diodes ZD1 to ZD3 which conduct when the power supply voltage Vc reaches a predetermined upper limit voltage VHH; a protection transistor TR12 for compulsorily turning OFF the drive transistor TR6 employed in the drive circuit 31 so as to turn ON the power MOSFET 16; and resistors R31 and R32 for turning ON the protection transistor TR12 (namely, power MOSFET is turned ON) by applying a bias voltage to the protection transistor TR12 due to break down currents flowing through the zener diodes ZD1 and ZD3 while these zener diodes are conducted.

Furthermore, the overvoltage protection circuit 30 of the present embodiment includes an NPN type transistor TR11 and a PNP type transistor TR13. The base of this NPN type transistor TR11 is connected via a resistor R35 to a junction point between a resistor R31 and a resistor R32, the base thereof is connected to the ground line (ground potential KG) of this apparatus, and the collector thereof is connected via a resistor R33 and a resistor R34 to the power supply line (power supply voltage VC) of this apparatus. The base of the PNP type transistor TR13 is connected to the junction point between the resistor R33 and the resistor R34, and the emitter as well as the collector thereof are connected to both terminals of the zener diode ZD1.

Accordingly, in the overvoltage protection circuit 30 of this embodiment, when the power supply voltage Vc reaches the upper limit voltage VHH, whereby the zener diodes ZD1 to ZD3 are conducted and the protection transistor TR12 is turned ON. At the same time, the transistor TR13 is turned ON, and the both ends of the zener diode ZD1 are shortcircuited by the transistor TR13. Thereafter, while the power supply voltage Vc becomes below the lower voltage VHL which is lower than the upper limit voltage VHH determined by the breakdown voltages of the zener diodes ZD2 and ZD3 by the breakdown voltage of the zener diode ZD1, the ON-state of the protection transistor TR12, namely the ON-state of the power MOSFET is maintained.

Referring now to a time chart shown in FIG. 6, operations and effects of the vehicle direction indicating apparatus with employment of the above-described circuit arrangement according to this embodiment will be described.

Since the circuit arrangement of the flicker circuit 22 is similar to that of the first embodiment, the explanation thereof is omitted.

Figure 6:
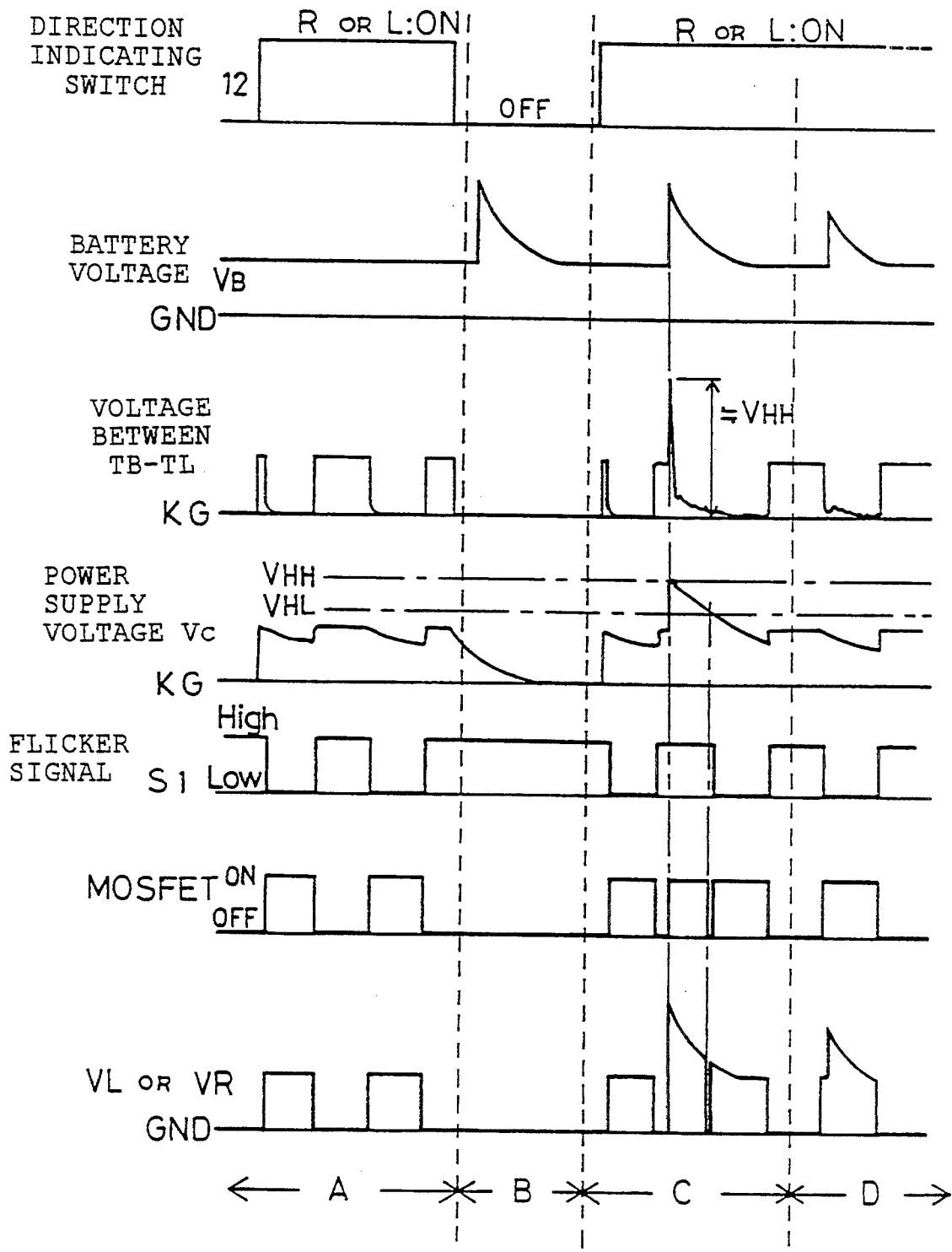
FIG. 6 is a time chart for representing operations of the overvoltage protection circuit indicated in FIG. 5.

First, a region "A" shown in FIG. 6 represents the normal operation of the flicker circuit.

Next, as shown in a region "B" of FIG. 6, when an overvoltage happens to occur under such a condition that the direction indicating switch 12 is turned OFF, since this apparatus is opened for the battery 14, the power MOSFET 16 and the internal circuits of this apparatus are not electrically destroyed by this overvoltage.

On the other hand, as illustrated in a region "C" of FIG. 6, when the direction indicating switch 12 is under ON-state and the flicker signal S1 is at the high level, namely the power MOSFET 16 is under OFF-state, an overvoltage is produced. When the power supply voltage Vc reaches the upper limit voltage VHH, the zener diodes ZD1 to ZD3 employed in the overvoltage protection circuit 30 are broken down, and the protection transistor TR12 is turned ON, so that the power MOSFET 16 is forcibly turned ON. At a time instance when the overvoltage happens to occur, the overvoltage is applied between the terminals TB and TL (namely, between source-to-drain of the power MOSFET 16). However, after this voltage is increased up to the substantially upper limit voltage VHH, the power MOSFET 16 is turned ON, so that this overvoltage is immediately lowered.

Then, as described above, when the power MOSFET 16 is turned ON, the power supply voltage Vc is gradually lowered from the upper limit voltage VHH in accordance with the capacitance of the power supply capacitor C1 and also the consumption currents of the internal circuit.

On the other hands, when the power MOSFET 16 is turned ON, and at the same time, both the transistors TR11 and TR13 employed in the overvoltage protection circuit 30 are turned ON, both ends of the zener diode ZD1 are shortcircuited. As a consequence, the ON-state of the power MOSFET 16 is continued until the power supply voltage Vc becomes the lower limit voltage VHL, and the normal ON/OFF control of the power MOSFET 16 is restarted at a time instant when the power supply voltage Vc is reduced to the lower limit voltage VHL.

During this time, since no such an overvoltage exceeding the upper limit voltage VHH is applied to the power MOSFET 16 and the internal circuit, there is no risk that the power MOSFET 16 and the semiconductors employed in the circuit are electrically destroyed in view of this overvoltage.

Since the gate of the power MOSFET 16 is biased by such a voltage defined based upon the breakdown voltages of the zener diodes ZD4 and ZD5, the power MOSFET 16 is brought into a very good ON-state. Moreover, since the power MOSFET 16 is not turned ON/OFF by the high frequency signal, there is no risk that the power MOSFET 16 is thermally destroyed, which is completely different from the prior art apparatus.

Subsequently, in case that an overvoltage happens to occur, as shown in a region "D" of FIG. 6, when the power MOSFET 16 is brought into the ON-state in response to the flicker signal S1 outputted from the flicker circuit 22, this overvoltage is discharged from the power MOSFET 16 through either the direction indicating lamp 10L, or the direction indicating lamp 10R, which constitutes a load. Accordingly, no overvoltage is applied to the power MOSFET 16 and also the internal circuit, and therefore no problem will be produced.

As previously described in detail, in the vehicle direction indicating apparatus according to this embodiment, the zener diodes ZD1 to ZD3 are employed as the overvoltage judging means for judging the occurrence of such an overvoltage. When the power supply voltage Vc reaches the upper limit voltage VHH determined based upon the breakdown voltages of the zener diodes ZD1 to ZD3, a decision is made that the overvoltage happens to occur, and therefore the power MOSFET 16 is forcibly turned ON. Further, after the power MOSFET 16 has been turned ON, the both terminals of the zener diode ZD1 are shortcircuited. The overvoltage judging voltage is changed into the lower limit voltage VHL which is determined by the breakdown voltages of the zener diodes ZD2 and ZD3. The time period is prolonged, during which after the power MOSFET 16 is turned ON, the power supply voltage Vc is lowered, and then the power MOSFET 16 is turned OFF. As a consequence, in accordance with this embodiment, such a convention problem that the power MOSFET 16 is turned ON/OFF at high speeds during the occurrence of the overvoltage, whereby the power MOSFET 16 is overheated, can be solved. Thus, the power MOSFET can be surely protected.

[FOURTH EMBODIMENT]

Figure 7:
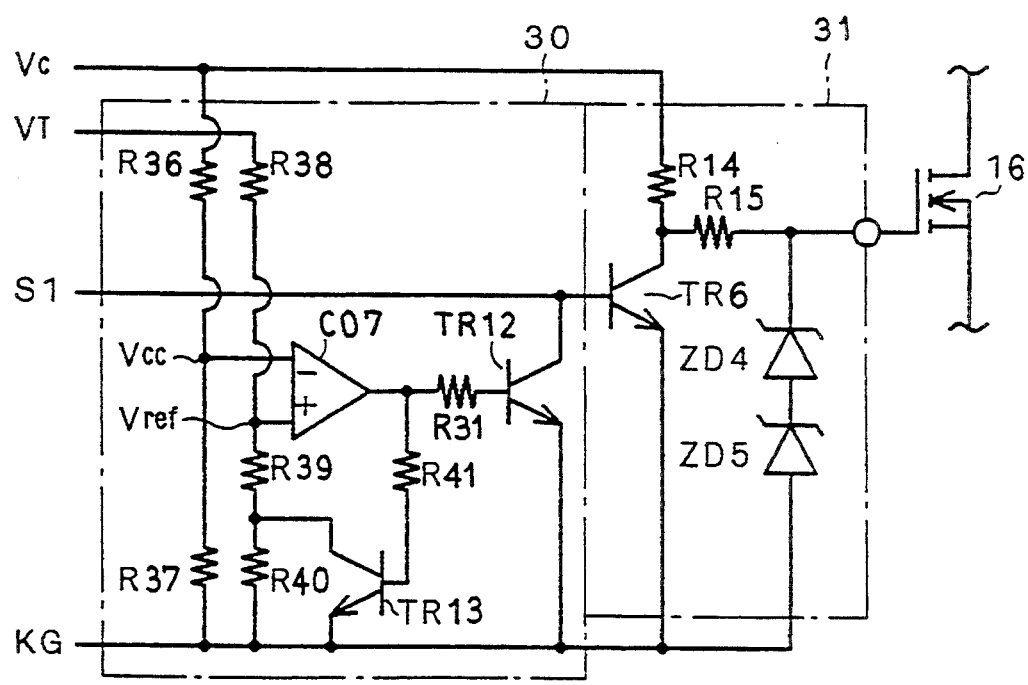
FIG. 7 is a circuit diagram for an alternative example of he overvoltage protection circuit employed in the load drive apparatus of FIG. 5.

It should be understood that in the above-described embodiment, the overvoltage protection circuit 30 has been arranged by employing the zener diodes ZD1 to ZD3 in order to judge presence of the overvoltage. Alternatively, this overvoltage protection circuit 30 may be constructed as shown in FIG. 7. That is, the power supply voltage Vc is subdivided by employing a dividing resistor R36 and a dividing resistor R37, and also the constant voltage VT from the constant voltage circuit is subdivided by using three dividing resistors R38 to R40 to produce a reference voltage Vref (=VHH) for judging presence of an overvoltage. A comparator CO7 is employed to compare the reference voltage Vref with the subdivided voltage VCC of the power supply voltage Vc obtained by the dividing resistors R36 and R37. When the subdivided voltage VCC becomes higher than, or equal to the reference voltage Vref, an overvoltage judging signal (high level) is produced from this comparator CO7 so as to turn ON the protection transistor TR12 via the resistor R31. Furthermore, during the overvoltage judging operation, the transistor TR13 is turned ON via a resistor R41 by receiving the judging signal from the comparator CO7, so that the dividing resistor R40 for producing the reference voltage Vref is shortcircuited, and thus the reference voltage Vref is substituted by another reference voltage Vref (=VHL) lower than the normal value. Accordingly, a similar effect to that of the above-described embodiment may be achieved in this modified embodiment.

Since the overvoltage protection circuit 30 is so arranged, the overvoltage detecting voltage (VHH), the overvoltage protection releasing voltage (VHL), and the overvoltage judging time can be freely set, as compared with the overvoltage protection circuit of the above-explained embodiment. Moreover, since this overvoltage protection circuit 30 owns no temperature characteristic such as a zener diode, the overvoltage protection can be performed in highly precision.

Although the overvoltage protection apparatus of the present invention has been applied to the vehicle direction indicating apparatus in the above-described embodiment, the present invention may be applied to such an apparatus that an N-channel power MOSFET utilized as a high-side switch is driven by a two-terminal type drive circuit, by which a similar advantage to the above-described embodiment can be achieved.

[FIFTH EMBODIMENT]

A description will now be made of one embodiment of the third aspect of the present invention with reference to FIG. 9.

It should be noted in the drawing that since the basic operation to turn ON/OFF the power MOSFET 16 with employment of the charging/discharging capacitor C0 has been explained in connection with the first embodiment, the explanation thereof is omitted. In FIG. 9, a resistor R4 is deleted.

Figure 9:
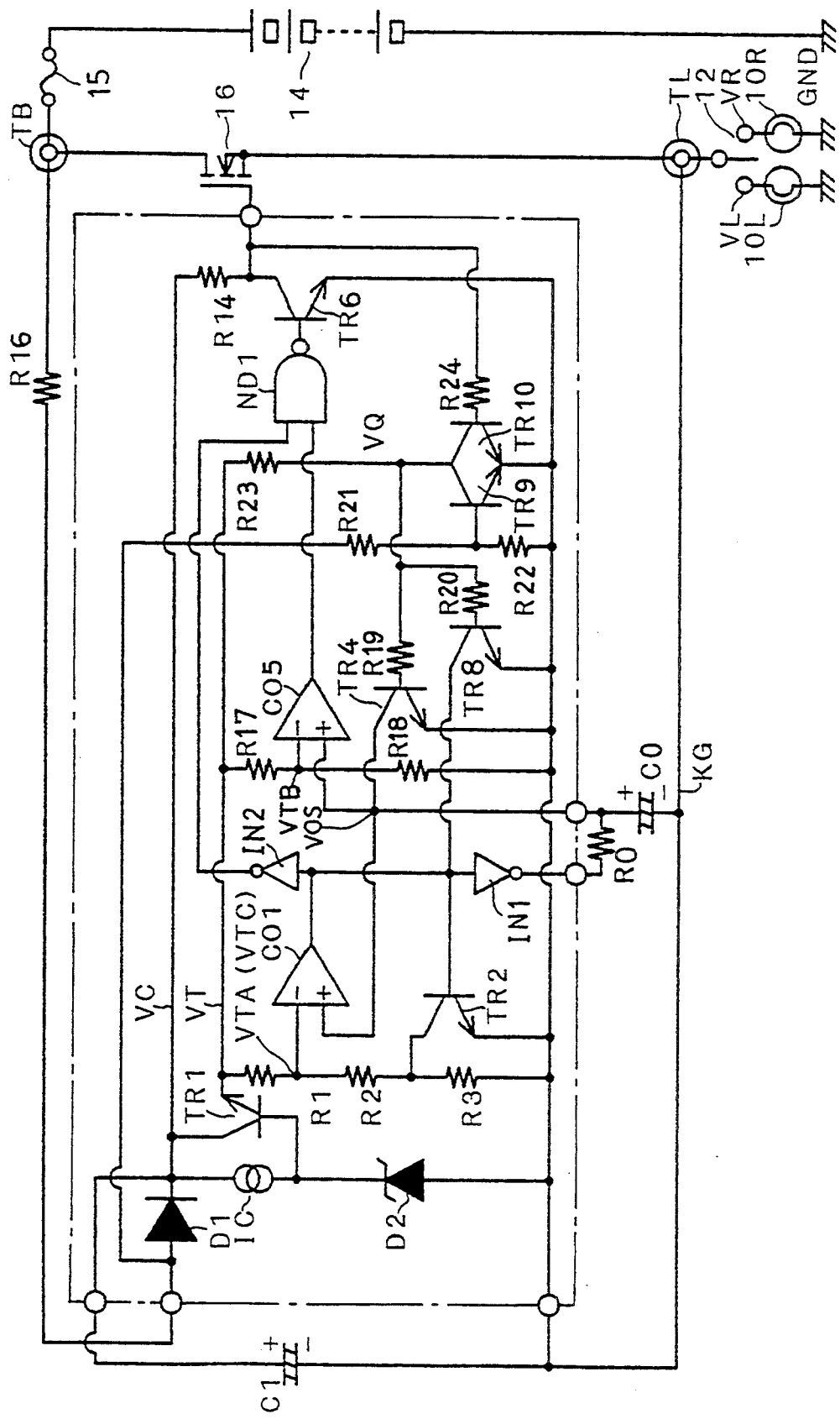
FIG. 9 is a circuit diagram of another load drive apparatus according to a fifth embodiment and a sixth embodiment of the present invention.

A featured circuit portion of FIG. 9 is a low-voltage-drive prohibiting circuit constructed as follows: That is, this low-voltage-drive prohibiting circuit is arranged by a resistor R21 and a resistor R22, which subdivide a potential at a junction TR9 biased by the voltage subdivided by these resistors R21 and R22, functioning as an output voltage detecting means defined in the present invention. This low-voltage-drive prohibiting circuit is further arranged by a transistor TR8 functioning as a second drive stopping circuit for forcibly controlling the output level of the comparator CO1 to a low level corresponding to the ground potential KG within this apparatus, in which when the subdivided voltage by the resistors R21 and R22 is lowered to turn OFF the transistor TR9, a bias voltage is applied thereto via the resistor R20, and then the output from the comparator CO1 is connected to the terminal TL, and a voltage apply prohibiting circuit (namely, NAND gate circuit ND1 in this embodiment) for prohibiting the apply of this bias voltage to the power MOSFET 16 in response to such a fact that the output level of the comparator CO1 is forcibly set to the low level.

By employing the above-explained low-voltage-drive prohibiting circuit, it is possible to prevent that the power MOSFET 16 is driven under low voltage since the terminal voltage of the power supply capacitor C1 is lowered, and thereafter the power MOSFET 16 is thermally destroyed.

It should be noted that the drive circuit for the power MOSFET 16 is constructed of this NAND gate circuit ND1, a resistor R13 whose one end is connected to the positive terminal of the power supply capacitor C1 and whose other end is connected to the gate of the power MOSFET 16, and a transistor TR7. This transistor TR7 is brought into an ON-state when the output from the NAND gate circuit ND1 is at the high level, and then the power MOSFET 16 is turned OFF by connecting the gate of the power MOSFET 16 to the terminal TL corresponding to the ground terminal of this apparatus. This transistor TR6 is brought into an OFF-state when the output of the NAND circuit ND1 is at the low level, and then the power MOSFET 16 is turned ON by applying the terminal voltage of the power supply capacitor Cl between the gate and the source of the power MOSFET 16.

Actually, in the circuit shown in FIG. 9, another transistor TR10 is provided other than the transistor TR9, by which the transistor TR8 corresponding to a second drive stopping circuit is controlled. Furthermore, it is employed a quick discharging transistor TR4 connected in parallel to the transistor TR8, which functions as a switch for discharging electron charges stored in the charging/discharging capacitor C0.

This quick discharging transistor TR4 corresponds to such a circuit that when the direction indicating switch 12 is turned OFF, the electron charges stored in the charging/discharging capacitor C0 is charging/discharging capacitor C0 is discharged, whereby the circuit may be driven from the initialized condition when the direction indicating switch 12 is subsequently turned ON. In other words, the quick discharging circuit 24 detects from the battery voltage VB applied to this apparatus that the direction indicating switch 12 is turned OFF when the power MOSFET 16 is turned OFF, whereby the transistor TR4 is turned ON to quickly discharge the charging/discharging capacitor C0. As a consequence, when the direction indicating switch 12 is subsequently turned ON, the charging operation of the charging/discharging capacitor C0 is commenced from such an initial condition that there is no electric charge, so that either the direction indicating lamp 10L, or the direction indicating lamp 10R is flickered in a constant time period just after the direction indicating switch 12 is turned ON.

It should be noted that this quick discharging circuit 24 may be used to quickly discharge the charging/discharging capacitor C0 when the constant voltage VT outputted from the constant voltage circuit becomes below a preselected voltage, whereby this apparatus cannot be operated under normal condition.

Next, a description will now be made how to surely detect that the direction indicating switch 12 is turned OFF in such a so-called "two-terminal type vehicle direction indicating apparatus as shown in FIG. 9.

That is to say, the voltage capable of driving the transistor is produced between the terminals TB and TL when the power MOSFET 16 is brought into the OFF-state while the direction indicating switch 12 is turned ON. When the direction indicating switch 12 is turned OFF, no voltage is produced between the terminals TB and TL. Also, a voltage produced between the terminals TB and TL when the direction indicating switch 12 is turned ON while the power MOSFET 16 is brought into the OFF-state, is substantially equal to the battery voltage.

Thus, in accordance with this embodiment, it is possible to judge whether or not the voltage between the terminals TB and TL is lower than a predetermined voltage by checking as to whether or not the transistor TR9 is turned OFF in such a manner that a bias voltage corresponding to the voltage between the terminals TB and TL is produced by way of the resistor R21 and R22, and then this bias voltage is applied to the base of the transistor TR9. The transistor TR10 is turned ON/OFF together with the power MOSFET 16, so that it is possible to judge the ON/OFF states of the power MOSFET 16 from this ON/OFF state. When the respective transistors TR9 and TR10 are brought into the OFF states, a judgement is made of either the OFF-state of the direction indicating switch 12, or the lowing state of the battery voltage, so that the quick discharging transistor TR4 is turned ON (at the same time, transistor TR8 for prohibiting the drive of the power MOSFET 16 is also turned ON).

It should also be noted that the circuit portions surrounded by a dot and dash line in FIG. 9 among the circuit arrangements for constituting the vehicle direction indicating apparatus of the embodiment, except for the power MOSFET 16, the resistor R16, the integrating circuit constructed of the resistor R0 and the charging/discharging capacitor C0, and the power supply capacitor C1, are stored within a single IC package. This is similar to that of FIG. 2. In FIG. 9, symbol "VB" indicates a voltage across terminals of the direction indicating lamp 10R, and symbol "VL" denotes a voltage across terminals of the direction indicating lamp 10L, and also symbol "VC" shows a voltage across the terminals of the power supply capacitor C1, respectively.

Figure 10:
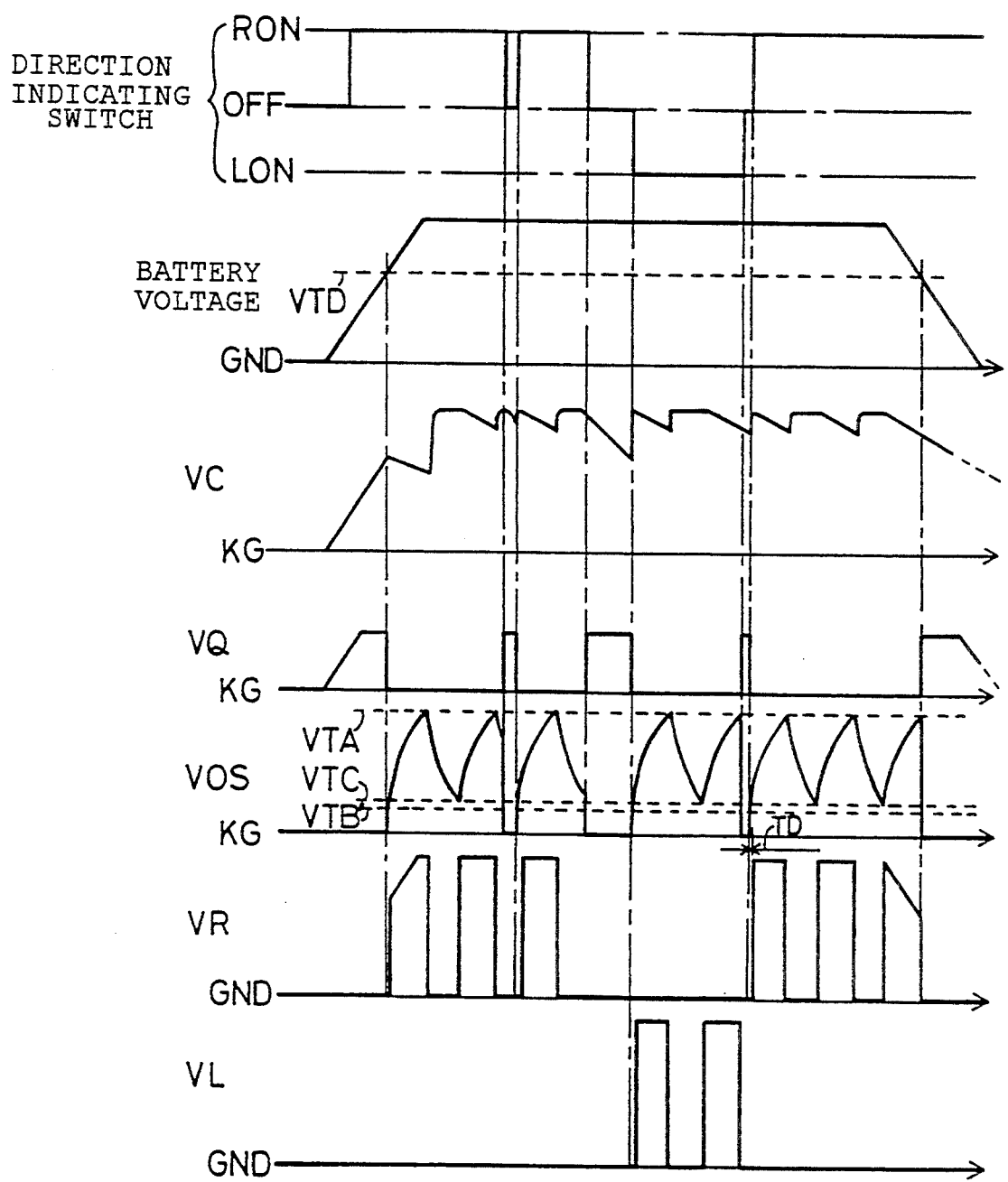
FIG. 10 is a time chart for indicating operations of the load drive apparatus shown in FIG. 9.

Next, a description will now be made of operations of the vehicle direction indicating apparatus with the above-described circuit arrangement according to the first embodiment with reference to a time chart shown in FIG. 10. In FIG. 10, reference symbols VOS, VQ, VC, VR, and VL represent voltages appearing at the various circuit portions of FIG. 1.

As represented in FIG. 10, when the direction indicating switch 12 is switched to turn ON the direction indicating lamp 10R by a car driver, and therefore is brought into the ON-state (RON), both the transistors TR4 and TR8 are brought into the ON-states if the battery voltage VB does not reach a predetermined voltage VTD, so that both ends of the charging/discharging capacitor C0 are shortcircuited, and also the output of the comparator CO1 is controlled to the low level. As a consequence, in case that the battery voltage is low, the power MOSFET 16 is not turned ON, and the low voltage is applied to the gate of the power MOSFET 16, so that it is possible to prevent the power MOSFET 16 from being thermally destroyed.

Subsequently, if the battery voltage is increased and reaches a predetermined voltage VTD, both the transistors TR4 and TR8 are under OFF-state. Since the terminal voltage VOS of the charging/discharging capacitor C0 becomes 0V at this time, the output of the comparator CO1 becomes the high level. Thereafter, the charging/discharging capacitor C0 is charged by the output from this comparator CO1 until the terminal voltage VOS thereof reaches the upper limit voltage VTA.

When this charging operation is commenced, since the terminal voltage VOS of the charging/discharging capacitor C0 is equal to 0V, the output from the initiating comparator CO5 becomes the low level. This situation is continued for a predetermined, time period TD defined after the charging operation is started and until the terminal voltage VOS of the charging/discharging capacitor C0 reaches the initiating voltage VTB. As a result, the power MOSFET 16 is not turned ON after the charging operation of the charging/discharging capacitor C0 is commenced and until the predetermined time period TD has passed. After the predetermined time period has elapsed, the power MOSFET 16 is turned ON.

Next, when after the charging operation of the charging/discharging capacitor C0 has been commenced and also the predetermined time period TD has elapsed, and then the output from the initiating comparator CO5 becomes the high level, then, the power MOSFET 16 is periodically turned ON/OFF in response to the output from the comparator CO1, which is varied in accordance with the above-described oscillating circuit. The direction indicating lamp 10R is flickered in response to the ON/OFF state.

Then, when the direction indicating switch 12 is turned OFF during this flicker operation, no voltage is produced between the terminals TB and TL even if the power MOSFET 16 is under the OFF-state. This situation is judged by the transistors TR9 and TR10, and thus the transistors TR4 and TR8 are controlled to the ON-state.

As a result, when the direction indicating switch 12 is switched from the ON-state into the OFF-state, the charging/discharging capacitor C0 is quickly discharged by the transistor TR4, so that the terminal voltage of this capacitor becomes 0V. Moreover, since the output of the comparator CO1 is controlled to the low level by the transistor TR8, the power MOSFET 16 is also brought into the OFF-state.

As described above, when after the direction indicating switch 12 has been switched to the OFF-state, the car driver switches this direction indicating switch 12 to turn ON the direction indicating light 10R, or 10L, and then the direction indicating switch 12 is brought into the ON-state (RON or LON), the oscillating circuit starts the charging operation for the charging/discharging capacitor C0 if the battery voltage reaches the preselected voltage VTD.

At this time, since the output of the initiating comparator CO5 becomes the low level until the terminal voltage VOS of the charging/discharging capacitor C0 reaches the initiating voltage VTB, the power MOSFET 16 is brought into the ON-state after the direction indicating switch 12 is turned ON and a preselected time period TD has elapsed. Thereafter, this power MOSFET 16 is turned OFF at such a time instant when a constant time period has passed where the terminal voltage VOS of the charging/discharging capacitor C0 becomes the upper limit voltage VTA.

As a result, according to this fifth embodiment, when the battery voltage reaches the preselected voltage VTD, both the ignition timing of the direction indicating lamp 10L, or 10R immediately after the direction indicating switch 12 is under ON-state, and the ignition time can be continuously made stable.

The reason why the drive operation of the power MOSFET 16 is prohibited by the operation of the initiating comparator CO5 during such a predetermined time period TD while the direction indicating switch 12 is brought into the ON-state, thereby to commence the charging operation of the charging/discharging capacitor C0 by the oscillator circuit, and thereafter the terminal voltage VOS of this capacitor reaches the initiating voltage VTB, is to surely store the electron charges capable of driving this apparatus into the power supply capacitor C1 during this prohibit period. As this time period TD, such a time period is set which requires to charge into the power supply capacitor C1, at least electron charges that are consumed so as to supply the power voltage when the power MOSFET 16 is turned ON.

As a result, in accordance with this embodiment, even when the direction indicating switch 12 is turned ON under such a condition that the power supply capacitor is completely discharged, the electron charges stored in the power supply capacitor C1 are discharged while the power MOSFET 16 is turned ON. There is no risk that the ON-time of the power MOSFET 16 becomes unstable. Thus, the stable ON/OFF control of the power MOSFET 16 can be continuously carried out.

[SIXTH EMBODIMENT]

Then, the vehicle direction indicating apparatus according to this sixth embodiment is comprised of dividing resistors R17 and R18 for subdividing the output voltage VT derived from the constant voltage circuit so as to produce a reference voltage (initiating voltage) VTB' which is slightly lower than the lower limit voltage VTC. Furthermore, this vehicle direction indicating apparatus employs an initiating comparator CO5 for comparing the initiating voltage VTB'=VT×R18/(R17+R18) subdivided by the resistors R17 and R18 with the terminal voltage VOS of the charging/discharging capacitor C0. This initiating comparator CO5 outputs a signal with a low level when this terminal voltage VOS is lower than the initiating voltage VTB', and another signal with a high level when the terminal voltage VOS becomes higher than the initiating voltage VTB'. In this vehicle direction indicating apparatus, the output of the initiating comparator CO5 is inputted to the NAND gate circuit ND1, so that the level of the output signal from the NAND gate circuit ND1 necessarily owns the high level until the terminal voltage VOS of the charging/discharging capacitor C0 reaches the initiating voltage VTB' irrelevant to the output from the oscillating comparator CO1. Accordingly, the power MOSFET 16 is turned OFF.

In other words, according to this sixth embodiment, the flicker signal S1 (drive signal) to the drive transistor TR6 may be obtained by NAND-gating both the signal which is produced by inverting the output signal of the comparator CO1 by the inverter IN2, and the signal outputted from the comparator C05.

[SEVENTH EMBODIMENT]

It should be noted that in the above-explained fifth embodiment, such a judging circuit is employed which is arranged by the transistor TR9 for judging the lowering state of the voltage between the terminals TB and TL, and by the transistor TR10 for judging the OFF-state of the power MOSFET 16 as the judging circuit for judging both the OFF-state of the direction indicating switch 12 and the lowering state of the battery voltage based on the voltage between the terminals TB and TL when the power MOSFET 16 is turned OFF. Since the judging operation cannot be carried out in such a judging circuit when the power MOSFET 16 is turned ON, when the direction indicating switch 12 is turned OFF during the ON-state of the power MOSFET 16, this situation cannot be detected by this judging circuit, so that the charging/discharging capacitor C0 cannot be quickly discharged.

Figure 11:
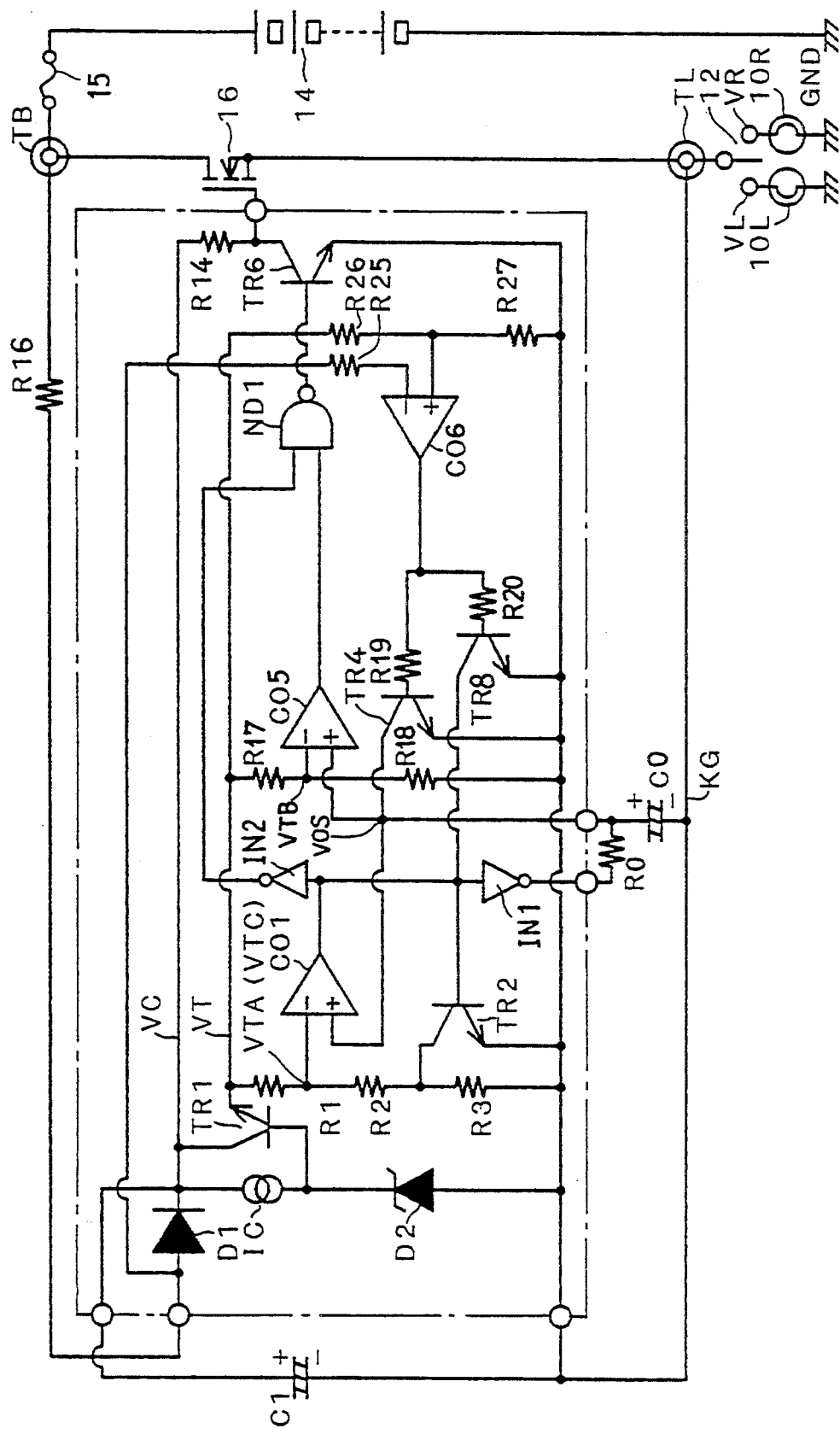
FIG. 11 is a circuit diagram for alternative example of the load drive apparatus shown in FIG. 9.

To quickly detect the switching operation of the direction indicating switch 12 from the ON-state to the OFF-state irrelevant to the ON/OFF states of the power MOSFET 16, a judging comparator CO6 may be employed as shown in FIG. 11. That is, this judging comparator CO6 compares a voltage appearing at a junction point between the diode D1 and the resistor R16, which is inputted via the resistor R25, with the reference voltage obtained by subdividing the constant voltage VT derived from the constant voltage circuit by using the resistors R26 and R27. Then, when this junction voltage is lower than the reference voltage, namely the voltage between the terminals TB and TL is lower than the reference voltage, a signal with a high level is outputted from this judging comparator CO6.

In other words, if the direction indicating switch 12 is under ON-state while turning ON the power MOSFET 16, then the current for turning on the direction indicating lamp 10L, or the direction indicating lamp 10R flows between the terminals TB and TL. As a consequence, although a very low voltage is produced between the terminals TB and TL, when the direction indicating switch 12 is turned OFF, no current flows between the terminals TB and TL, so that such a very low voltage is not produced. As a result, as shown in FIG. 11, if such a measure is taken, then the ON-to-OFF switch operation of the direction indicating switch 12 may be judged irrelevant to the ON/OFF states of the power MOSFET 16, so that the charging/discharging capacitor C0 can be quickly discharged. That is to say, a very low reference voltage is produced by way of the resistor R26 and R27, the judging comparator CO6 judges the OFF-state of the direction indicating switch 12 by checking whether or not the junction voltage between the resistor R16 and the diode D1 is below this very low reference voltage. Then, the transistors TR4 and TR8 are turned ON in response to the signal with the high level derived from this judging comparator CO6.

It should be understood that the judging comparator CO6 cannot judge the lowing condition of the battery voltage when the OFF-state of the direction indicating switch 12 can be judged by this judging comparator CO6 even if the power MOSFET 16 is turned ON. Therefore, as in the first embodiment of FIG. 1, another judging circuit must be employed in order that the lowing condition of the battery voltage is judged to stop the drive operation of the power MOSFET 16. This judging circuit may judge the lowing condition of the battery voltage from the voltage between the terminals TB and TL during the OFF-state of the power MOSFET 16.

There is represented in FIG. 11 the circuit arrangement of the vehicle direction indicating apparatus according to the second embodiment, in which the judging circuit constructed of the transistors TR9 and TR10 employed in the vehicle direction indicating apparatus indicated in FIG. 9 has been changed into the above-explained judging circuit made of the judging comparator CO6. Since other circuit portions than the above-described circuit portions are completely similar to those of the direction indicating apparatus shown in FIG. 1, the same reference numerals used in FIG. 1 are employed for denoting those, and the descriptions thereof are omitted.

What is claimed is:
1. A load drive apparatus comprising:
a charging/discharging capacitor;
a charging/discharging circuit for charging/recharging said capacitor at a predetermined time constant in such a manner that a voltage across said capacitor is varied between a preset upper limit voltage and a preset lower limit voltage;
a drive circuit for turning ON a power transistor series-connected to a current path employed to supply a current from a DC power source to a load, thereby driving the load when said charging/discharging circuit causes said capacitor to be charged, or said voltage across said capacitor is higher than, or equal to a predetermined voltage defined between said upper limit voltage and said lower limit voltage;
overcurrent judging means for judging whether or not a voltage across terminals of said power transistor connected to said current path exceeds an overcurrent judging voltage;
upper limit voltage changing means for changing said upper limit voltage at which said charging/discharging circuit stops the charging operation of said capacitor and starts the discharging operation thereof, into a value normally higher than a drive stopping judgement voltage when said overcurrent judging means judges that said voltage across terminals of said power transistor exceeds said overcurrent judging voltage; and.
first drive stopping means for compulsorily turning OFF said power transistor and further for holding said charging/discharging circuit to the charging state of said capacitor by judging whether or not said voltage across said capacitor is higher than, or equal to said drive stopping judgement voltage when said voltage across said capacitor becomes higher than, or equal to said drive stopping judgement voltage.
2. The load drive apparatus as claimed in claim 1, wherein said overcurrent judging means includes a means for producing a voltage corresponding to a load current flowing through said load and a means for compensating said produced voltage to such a voltage adapted to a temperature characteristic of said power transistor.
3. The load drive apparatus as claimed in claim 1, wherein said current path owns a DC power source connecting terminal, a load connecting terminal and a load connection switch for connecting said load connecting terminal to said load; and further comprising:
an auxiliary power source connected parallel to said power transistor, for storing electron charges into a power supply capacitor by said voltage across terminals of said power transistor, and for producing a power supply voltage by said electron charges stored in said power supply capacitor and a voltage across both said DC power source connecting terminal and said load connecting terminal; and
a load circuit operated by receiving the supply of power from said auxiliary power source, for turning ON/OFF said power transistor in .response to a control signal externally inputted, thereby to drive said load.
4. The load drive apparatus as claimed in claim 3, further comprising:
overvoltage judging means for making such a judgement that an overvoltage happens to occur in said DC power source when said power supply voltage applied from said auxiliary power source exceeds a predetermined judging voltage;
judging voltage setting means for setting said judging voltage to a first judging voltage unless said overvoltage judging means judges the occurrence of said overvoltage, and for setting said judging volt- age to a second judging voltage lower than said first judging voltage by a predetermined voltage while said overvoltage judging means judges the occurrence of said overvoltage; and protection means for turning ON said power transistor when said overvoltage judging means judges the occurrence of said overvoltage.

5. The load drive apparatus as claimed in claim 2, wherein said current path owns a DC power source connecting terminal, a load connecting terminal and a load connection switch for connecting said load connecting terminal to said load; and further comprising:

an auxiliary power source connected parallel to said power transistor, for storing electron charges into a power supply capacitor by said voltage across terminals of said power transistor, ;and for producing a power supply voltage by said electron charges stored in said power supply capacitor and a voltage across both said DC power source connecting terminal and said load connecting terminal; and a load circuit operated by receiving the supply of power from said auxiliary power source, for turning ON/OFF said power transistor in response to a control signal externally inputted, thereby to drive said load.

6. The load drive apparatus as claimed in claim 5, further comprising:

overvoltage judging means for making such a judgement that an overvoltage happens to occur in said DC power source when said power supply voltage applied from said auxiliary power source exceeds a predetermined judging voltage;

judging voltage setting means for setting said judging voltage to a first judging voltage unless said overvoltage judging means judges the occurrence of said overvoltage, and for setting said judging voltage to a second judging voltage lower than said first judging voltage by a predetermined voltage while said overvoltage judging means judges the occurrence of said overvoltage; and protection means for turning ON said power transistor when said overvoltage judging means judges the occurrence of said overvoltage.

7. The load drive apparatus as claimed in claim 1, further comprising:

output voltage detecting means for detecting an output voltage from said DC power source; and second drive stopping means for stopping the drive operation of said power transistor when said output voltage detecting means detects a lowering condition of said output voltage from said DC power source.

8. The load drive apparatus as claimed in claim 4, further comprising:

output voltage detecting means for detecting an output voltage from said DC power source or said auxiliary power source; and second drive stopping means for stopping the drive operation of said power transistor when said output voltage detecting means detects a lowering condition of said output voltage from said DC power source or said auxiliary power source.

9. The load drive apparatus as claimed in claim 7, wherein said second drive stopping means includes a means for varying an output from said charging/discharging circuit to thereby stop the drive operation of said power transistor when said output voltage detecting means detects the lowering condition of the output voltage from said DC power source.

10. The load drive apparatus as claimed in claim 8, wherein said second drive stopping means includes a means for varying an output from said charging/discharging circuit to thereby stop the drive operation of said power transistor when said output voltage detecting means detects the lowering condition of the output voltage from said DC power source or said auxiliary power source.

11. The load drive apparatus as claimed in claim 7, further comprising:

condition detecting means for detecting the lowing condition of the output voltage by said output voltage detecting means and an OFF-state of said power transistor; and quick discharging means for quickly discharging said charging/discharging capacitor when the OFF-state of said power transistor is detected by said condition detecting means.

12. The load drive apparatus as claimed in claim 8, further comprising:

condition detecting means for detecting the lowing condition of the output voltage by said output voltage detecting means and an OFF-state of said power transistor; and quick discharging means for quickly discharging said charging/discharging capacitor when the OFF-state of said power transistor is detected by said condition detecting means.

13. The load drive apparatus as claimed in claim 10, further comprising:

condition detecting means for detecting the lowing condition of the output voltage by said output voltage detecting means and an OFF-state of said power transistor; and quick discharging means for quickly discharging said charging/discharging capacitor when the OFF-state of said power transistor is detected by said condition detecting means.

14. The load drive apparatus as claimed in claim 7, further comprising:

a drive signal output prohibiting circuit for prohibiting the output of the drive signal for said power transistor from said charging/discharging circuit to said drive circuit when said voltage across said charging/discharging capacitor becomes lower than, or equal to a predetermined voltage which is below two different voltage values varying during said charging/discharging operations.

15. The load drive apparatus as claimed in claim 8, further comprising:

a drive signal output prohibiting circuit for prohibiting the output of the drive signal for said power transistor from said charging/discharging circuit to said drive circuit when said voltage across said charging/discharging capacitor becomes lower than, or equal to a predetermined voltage which is below two different voltage values varying during said charging/discharging operations.

16. The load drive apparatus as claimed in claim 10, further comprising:

a drive signal output prohibiting circuit for prohibiting the output of the drive signal for said power transistor from said charging/discharging circuit to said drive circuit when said voltage across said charging/discharging capacitor becomes lower than, or equal to a predetermined voltage which is below two different voltage values varying during said charging/discharging operations.

17. The load drive apparatus as claimed in claim 13, further comprising:

a drive signal output prohibiting circuit for prohibiting the output of the drive signal for said power transistor from said charging/discharging circuit to said drive circuit when said voltage across said charging/discharging capacitor becomes lower than, or equal to a predetermined voltage which is below two different voltage values varying during said charging/discharging operations.

* * * * *